(12) United States Patent
Yang

(10) Patent No.: US 11,515,502 B2
(45) Date of Patent: Nov. 29, 2022

(54) DISPLAY DEVICE

(71) Applicant: Samsung Display Co., LTD., Yongin-si (KR)

(72) Inventor: Donghyun Yang, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 84 days.

(21) Appl. No.: 17/094,864

(22) Filed: Nov. 11, 2020

(65) Prior Publication Data
US 2021/0265588 A1    Aug. 26, 2021

(30) Foreign Application Priority Data
Feb. 26, 2020   (KR) .......................... 10-2020-0023609

(51) Int. Cl.
*G06F 1/16*      (2006.01)
*H01L 51/52*    (2006.01)
*H01L 27/32*    (2006.01)

(52) U.S. Cl.
CPC ........ H01L 51/5237 (2013.01); G06F 1/1616 (2013.01); G06F 1/1652 (2013.01);
(Continued)

(58) Field of Classification Search
CPC .... G06F 1/1652; G06F 1/1681; G06F 1/1616; G06F 1/1641; G06F 1/1626; G06F 1/1615; G06F 1/1601; G06F 1/16; G06F 1/1643; G06F 1/1618; G06F 1/1637; G06F 1/1656; G06F 1/165; G06F 2203/04102; H05K 5/0017; H05K 5/0226; H05K 5/028; H05K 5/03; H05K 5/056; H05K 5/0021; H05K 5/0086; H01L 51/5237; H01L 27/3244; H01L 2251/5338; H01L 51/524; H01L 51/0097; G02F 1/133311; G09F 9/301; Y02E 10/549

See application file for complete search history.

(56) References Cited

U.S. PATENT DOCUMENTS 8,804,324 B2 *   8/2014   Bohn ................... G06F 1/1681
                                               361/679.55
9,250,733 B2     2/2016   Lee et al.
(Continued)

FOREIGN PATENT DOCUMENTS

KR        10-1875855 B1    7/2018
KR      1020190018334 A    2/2019
(Continued)

*Primary Examiner* — Abhishek M Rathod
(74) *Attorney, Agent, or Firm* — Cantor Colburn LLP

(57) ABSTRACT

A display device includes a display panel including a folding area at which the display device is foldable and unfoldable; a first casing and a second casing arranged in a first direction along the display panel, the first casing and the second casing spaced apart from each other at the folding area; a third casing between the first casing and the second casing along the first direction, the third casing corresponding to the folding area; and a cover facing the display panel with the third casing therebetween, the cover connected to each of the first casing and the second casing. Folding and unfolding of the display device respectively includes extension of the cover from of the first casing and retraction of the cover into the first casing.

19 Claims, 15 Drawing Sheets

(52) U.S. Cl.
CPC ........ *G06F 1/1681* (2013.01); *H01L 27/3244* (2013.01); *H01L 2251/5338* (2013.01)

(56) References Cited

U.S. PATENT DOCUMENTS

| | | | |
|---|---|---|---|
| 2002/0104769 A1* | 8/2002 | Kim | G06F 1/1681 206/320 |
| 2010/0201604 A1 | 8/2010 | Kee et al. | |
| 2015/0077917 A1* | 3/2015 | Song | G06F 1/1652 361/679.27 |
| 2015/0177789 A1* | 6/2015 | Jinbo | H01L 27/323 313/511 |
| 2016/0091923 A1* | 3/2016 | Morrison | G06F 1/1681 345/55 |
| 2016/0143162 A1* | 5/2016 | Van Dijk | H05K 5/0017 361/679.01 |
| 2017/0142847 A1* | 5/2017 | Park | G06F 1/1681 |
| 2018/0242466 A1 | 8/2018 | Lee et al. | |
| 2018/0295735 A1 | 10/2018 | Ahn | |
| 2019/0196544 A1* | 6/2019 | Mizoguchi | G06F 1/1652 |
| 2019/0339738 A1* | 11/2019 | Hou | G06F 1/1615 |
| 2020/0412401 A1* | 12/2020 | Kim | H04M 1/0214 |
| 2021/0191459 A1 | 6/2021 | Kim et al. | |

FOREIGN PATENT DOCUMENTS

| | | |
|---|---|---|
| KR | 1020190065640 A | 6/2019 |
| KR | 1020210079461 A | 6/2021 |

\* cited by examiner

DISPLAY DEVICE

This application claims priority to Korean Patent Application No. 10-2020-0023609 filed on Feb. 26, 2020, and all the benefits accruing therefrom under 35 U.S.C. § 119, the disclosure of which is hereby incorporated by reference in its entirety.

BACKGROUND

(1) Field

The invention relates to a display device.

(2) Description of the Related Art

Electronic products such as smart phones, digital cameras, laptop computers, navigation systems and smart televisions include a display device for displaying an image. The display device generates an image and provides the image displayed on a display screen.

With the advancement of display technology, various types of display devices have been developed. A flexible display device may be curvedly deformable, foldable or rollable. The flexible display device capable of being deformed in various shapes allows for improvement in portability and use of the display device.

SUMMARY

Among flexible display devices, the foldable display device is foldable with respect to a folding axis that extends in one direction. The foldable display device may include a display module and a plurality of casings that accommodate the display module. Foreign substances may be introduced into the display module through empty spaces between the casings. One or more embodiment provides a display device which reduces or effectively prevents introduction of foreign substances into the display module.

According to embodiments of the invention, a display device includes a display panel including a folding area at which the display device is foldable and unfoldable; a first casing and a second casing arranged in a first direction along the display panel, the first casing and the second casing spaced apart from each other at the folding area; a third casing between the first casing and the second casing along the first direction, the third casing corresponding to the folding area; and a cover facing the display panel with the third casing therebetween, the cover connected to each of the first casing and the second casing Folding and unfolding of the display device respectively includes extension of the cover from of the first casing and retraction of the cover into the first casing.

In an embodiment, the cover may be fixed to the second casing.

In an embodiment, the cover may include a first part in a first cavity of the first casing; a second part in a second cavity of the second casing; and a third part below the third casing and between the first casing and the second casing.

In an embodiment, the first cavity may be open at a side of the first casing and may extend along the first direction. The side of the first casing may face the second casing. The second cavity may be open at a side of the second casing and may extend along the first direction. The side of the second casing may face the first casing.

In an embodiment, the folding and unfolding of the display device may respectively include extension and retraction of the first part from and into the first cavity.

In an embodiment, the display device may further include a first elastic member in the first cavity and connected to the first part.

In an embodiment, the first elastic member may be connected to the first casing at a distal end of the first cavity.

In an embodiment, the second part may be connected to the second casing at a distal end of the second cavity.

In an embodiment, the folding and unfolding of the display device may respectively include extension and retraction of the second part from and into the second cavity.

In an embodiment, the display device may further include a second elastic member in the second cavity and connected to the second part. The second elastic member may be connected to the second casing at a distal end of the second cavity.

In an embodiment, the display device may further include a roller which is disposed in the first cavity and around which the first part is rollable and unrollable.

In an embodiment, the first cavity may include: a first space which is defined at a distal end of the first cavity and in which the roller is disposed; and a tunnel between the first space and an entrance of the first cavity. In a view along the first direction, a size of the first space may be greater than a size of the tunnel.

In an embodiment, the cover may include a resilient metal.

In an embodiment, the display panel may include: a first non-folding area corresponding to the first casing; and a second non-folding area corresponding to the second casing, the first and second non-folding areas being arranged along the first direction with the folding area therebetween.

In an embodiment, the display device which is bent may include disposing a top surface of the display panel at the first non-folding area facing a top surface of the display panel at the second non-folding area.

In an embodiment, the display device may further include: a first sub-supporter between the first casing and the first non-folding area; a second sub-supporter between the second casing and the second non-folding area; a third sub-supporter between the first casing and the first sub-supporter; and a fourth sub-supporter between the second casing and the second sub-supporter.

In an embodiment, a bottom surface of the third casing may have a curved surface that is convex downwardly. A top surface of the third casing may have a curved surface that is concave downwardly.

In an embodiment, the first casing may include: a first casing part that extends along the bottom surface of the third casing and protrudes upwardly toward the first sub-supporter; and a second casing part that extends along the first direction from the first casing part to be below the third sub-supporter. The second casing may include: a third casing part that extends along the bottom surface of the third casing and protrudes upwardly toward the second sub-supporter; and a fourth casing part that extends along the first direction from the third casing part to be below the fourth sub-supporter.

In an embodiment, the third sub-supporter may be spaced apart from the first casing part and may be below the first sub-supporter. The fourth sub-supporter may be spaced apart from the third casing part and may be below the second sub-supporter.

According to embodiments of the invention, a display device includes a display panel including a folding area at which the display device is foldable and unfoldable; a case including a first casing and a second casing arranged in a first direction along the display panel, the first casing and the second casing spaced apart from each other at the folding area; a third casing between the first casing and the second casing along the first direction, and corresponding to the folding area; and a cover facing the display panel with the third casing therebetween. At the folding area, a portion of the cover is outside of both the first casing and the second casing, and folding and unfolding of the display device respectively includes extension of the portion of the cover from the case and retraction of the cover into the case.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

Figure 1:
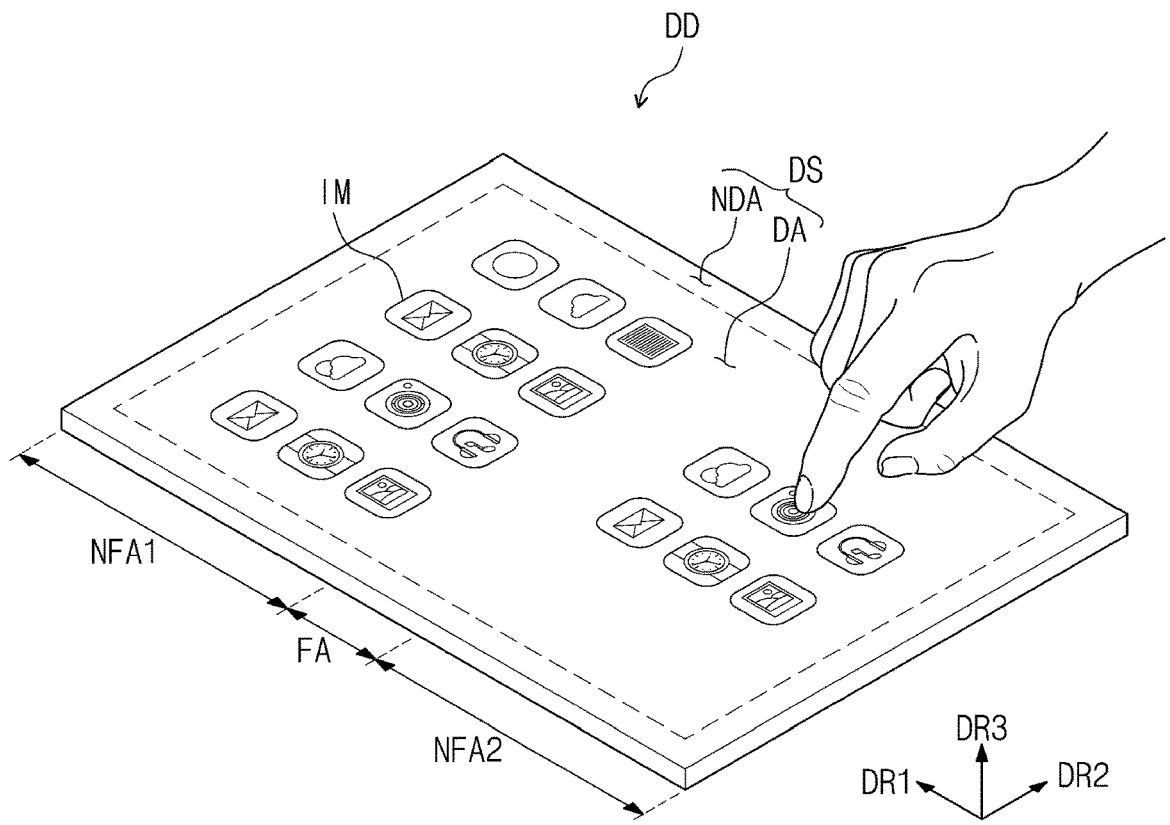
FIG. 1 illustrates a perspective view showing an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this description, when a component (or region, layer, portion, etc.) is referred to as being related to another component such as being "on," "connected to" or "coupled to" other component(s), the component may be directly disposed on, directly connected to or directly coupled to the other component(s) (i.e., with no intervening component therebetween) or at least one intervening component may be present therebetween.

Like numerals indicate like components. Moreover, in the drawings, thicknesses, ratios, and dimensions of components are exaggerated for effectively explaining the technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the scope of the invention. Unless the context clearly indicates otherwise, the singular forms are intended to include the plural forms as well.

In addition, the terms "beneath," "lower," "above," "upper" and the like are used herein to describe one component's relationship to other component(s) illustrated in the drawings. The relative terms are intended to encompass different orientations in addition to the orientation depicted in the drawings.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

It should be understood that the terms "comprise," "include," "have" and the like are used to specify the presence of stated features, integers, steps, operations, components, elements, or combinations thereof, but do not preclude the presence or addition of one or more other features, integers, steps, operations, components, elements, or combinations thereof.

The following will now describe in detail embodiments of the invention in conjunction with the accompanying drawings.

Figure 2:
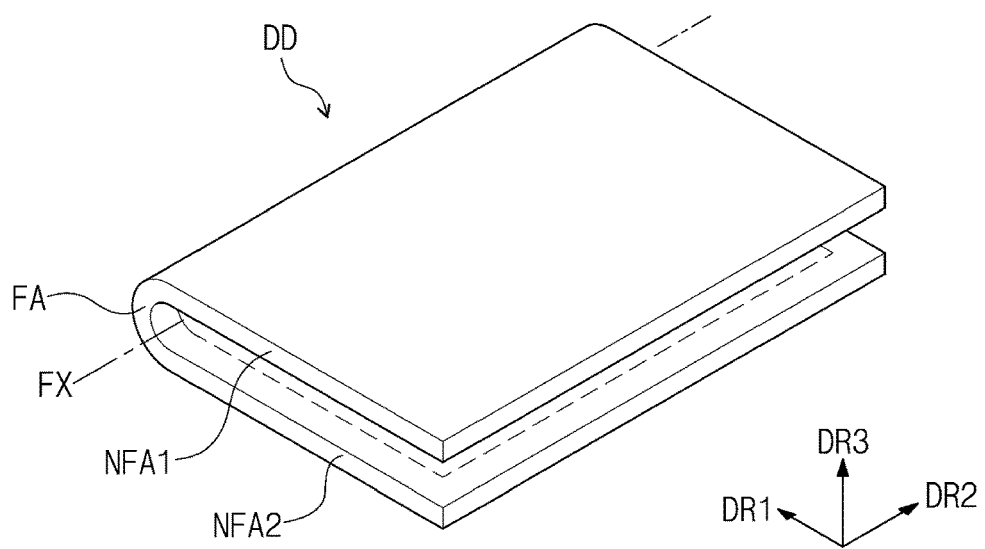
FIG. 2 illustrates a perspective view showing the display device depicted in FIG. 1 which is folded.

FIG. 1 illustrates a perspective view showing an embodiment of a display device DD. FIG. 2 illustrates a perspective view showing the display device DD depicted in FIG. 1, which is folded.

Referring to FIG. 1, a display device DD may have a rectangular shape defined by long sides that extend along a first direction DR1 and short sides that extend along a second direction DR2 which intersects or crosses the first direction DR1. The display device DD is not limited thereto, and may have various planar shapes, such as a circular shape or a polygonal shape. The display device DD may be flexible. Various components of the display device DD may be bendable, foldable, unfoldable, etc. together with each other in bending, folding and/or unfolding of the display device DD.

A third direction DR3 is defined herein as a direction that substantially intersects a plane defined or formed by the first and second directions DR1 and DR2. In this description, the phrase "when viewed in plan" or "in a plan view" may mean "when viewed along the third direction DR3." A thickness of the display device DD and various components thereof is defined along the third direction DR3 (e.g., a thickness direction of the display device DD).

The display device DD may include a first non-folding area NFA1, a second non-folding area NFA2, and a folding area FA disposed between the first non-folding area NFA1 and the second non-folding area NFA2. The first non-folding area NFA1, the folding area FA and the second non-folding area NFA2 may be arranged in order along the first direction DR1. Various components of the display device DD may include a first non-folding area NFA1, a second non-folding area NFA2 and a folding area FA corresponding to those described for the display device DD.

Although one of the folding area FA and two non-folding areas are exemplarily illustrated, limitations are not imposed on the number of folding areas or the number of non-folding areas. In an embodiment, for example, the display device DD may include more than two non-folding areas and a plurality of folding areas respectively disposed between the more than two non-folding areas.

The display device DD may have or define a top surface furthest in the third direction DR3, which is defined as a display surface DS and is in a plane parallel to a plane defined by the first and second directions DR1 and DR2 which cross each other. The display surface DS may provide an image IM generated from the display device DD to outside the display device DD.

The display surface DS may include a display area DA and a non-display area NDA which is adjacent to the display area DA. The image IM may be displayed at display area DA, and the image IM may not be displayed at the non-display area NDA. In a plan view, the non-display area NDA may surround the display area DA. The non-display area NDA may define an edge of the display device DD and may have a color such as by a printed color material.

Referring to FIG. 2, the display device DD may be foldable and/or unfoldable. In an embodiment, for example, the display device DD and components thereof may be bendable at the folding area FA with respect to a folding axis FX parallel to the second direction DR2, and the display device DD may be folded about the folding axis FX. The display device DD and components thereof may not be bendable at the non-folding areas and/or may remain flat even when the display device DD is folded about the folding axis FX.

Referring to FIG. 2, the display device DD which is folded may dispose portions of the display surface DS at the first and second non-folding areas NFA1 and NFA2 facing each other. Therefore, the display device DD may be in-foldable (FIG. 2) or folded inwardly, to avoid exposure of the display surface DS to outside the display device DD.

Figure 3:
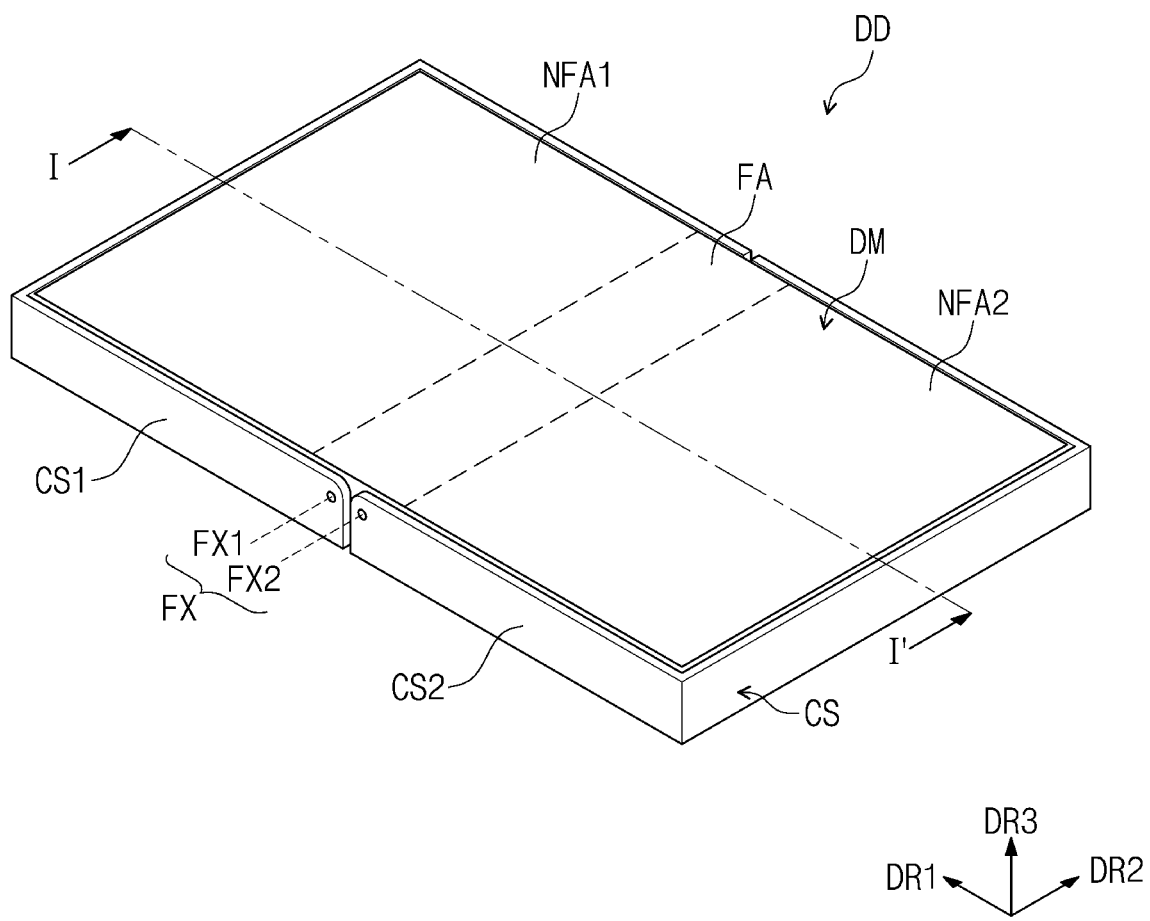
FIG. 3 illustrates a perspective view showing an embodiment of the display device depicted in FIG. 1.
Figure 4:
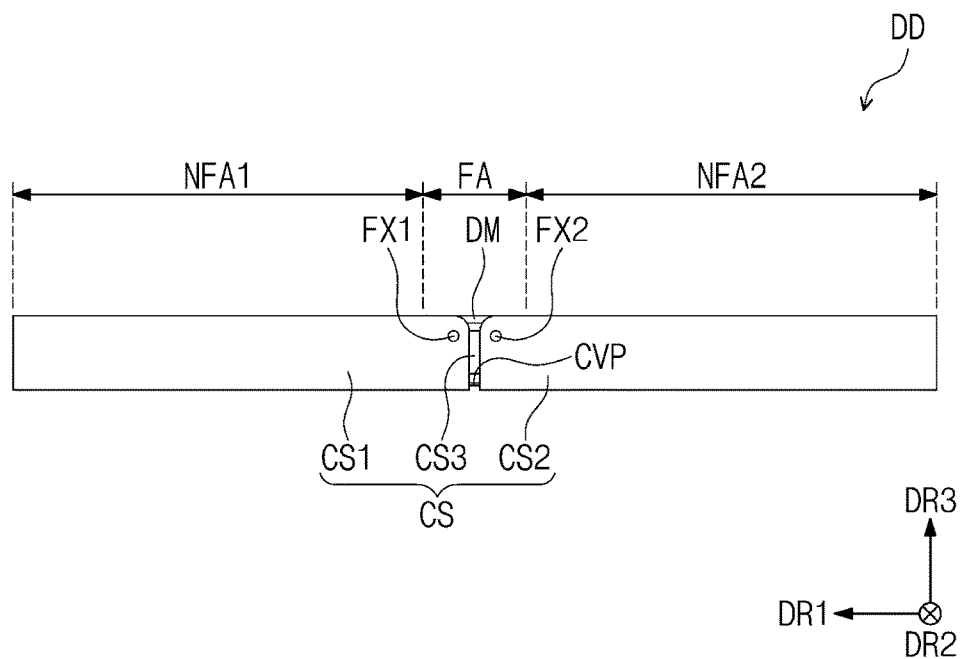
FIGS. 4, 5 and 6 illustrate cross-sectional views showing embodiments of the display device depicted in FIG. 3 which is unfolded and folded.
Figure 5:
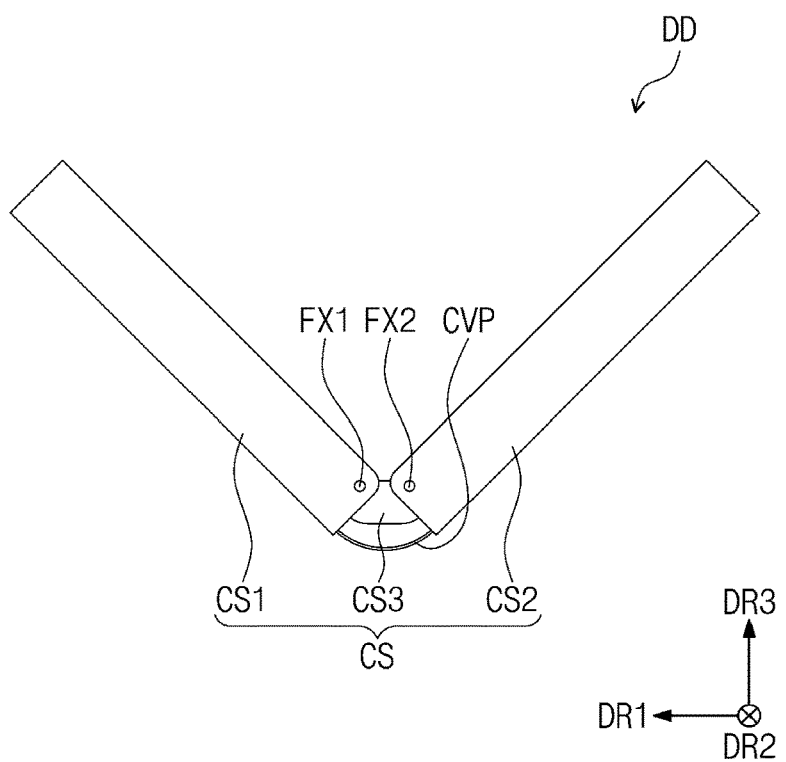
Figure 6:
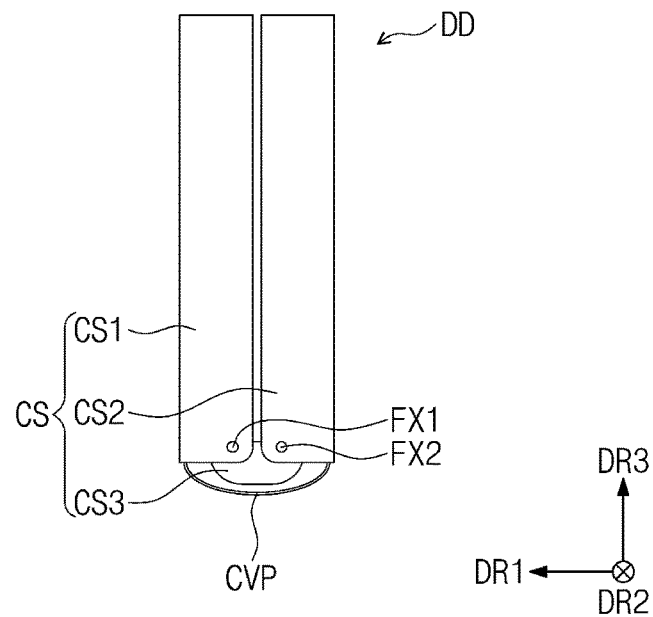

FIG. 3 illustrates a perspective view showing an embodiment of the display device DD depicted in FIG. 1. FIGS. 4, 5 and 6 illustrate cross-sectional views showing embodiments of the display device DD depicted in FIG. 3.

FIGS. 4, 5 and 6 show a lateral or side surface of the display device DD when viewed along the second direction DR2.

Referring to FIG. 3, the display device DD may include a display module DM and a casing CS (e.g., case) in which is accommodated the display module DM. The display module DM which is flat may be in a plane parallel to a plane defined by the first and second directions DR1 and DR2.

The display module DM which is flat may have a rectangular shape defined by long sides that extend along the first direction DR1 and short sides that extend along the second direction DR2. However, the display module DM is not limited thereto, and may have various planar shapes, such as a circular shape or a polygonal shape, depending on the shape of the display device DD. The display module DM may be flexible.

The display module DM may include a first non-folding area NFA1, a folding area FA, and a second non-folding area NFA2 that are arranged in order along the first direction DR1. The folding area FA may be disposed between the first non-folding area NFA1 and the second non-folding area NFA2. During folding of the display device DD, components of the display module DM may be bendable at the folding area FA to fold the display module DM.

The casing CS may include a first casing CS1 (e.g., first casing portion) and a second casing CS2 (e.g., second casing portion) that are arranged along the first direction DR1. The first casing CS1 and the second casing CS2 may be connected to each other to accommodate the display module DM. The display device DD which is flat may dispose the first casing CS1 and the second casing CS2 spaced apart from each other at the folding area FA, without being limited thereto. The first casing CS1 and the second casing CS2 which are spaced apart from each other are disposed in a same plane as each other (e.g., coplanar with each other).

The casing CS may have a folding axis FX defined therein. The folding axis FX may be provide in plural to include more than one of the folding axis FX that are each parallel to the second direction DR2. In an embodiment, for example, the folding axis FX which provided in plural may include a first folding axis FX1 and a second folding axis FX2 that each extend along the second direction DR2 and are spaced apart from each other along the first direction DR1.

The first casing CS1 may have the first folding axis FX1 defined at a first side of the first casing CS1 which is closest to the second casing CS2. The second casing CS2 may have the second folding axis FX2 defined at a first side of the second casing CS2 which is closest to the first casing CS1. The first side of the first casing CS1 and the first side of the second casing CS2 may face each other along the first direction DR1.

Referring to FIGS. 4, 5 and 6, the first casing CS1 and the second casing CS2 may be rotatable about the first folding axis FX1 and the second folding axis FX2, respectively. Respective rotations of the first and second casings CS1 and CS2 may allow the display device DD and various components thereof to be bent or folded at the folding area FA.

The casing CS may include a third casing CS3 (e.g., third casing portion) disposed between the first casing CS1 and the second casing CS2. Along the thickness direction, the third casing CS3 may be below the display module DM, at a side of the display module DM which is furthest from the display surface DS. The third casing CS3 may reduce or effectively prevent exposure of a lower portion of the display module DM which is between the first casing CS1 and the second casing CS2, to outside the casing CS. The third casing CS3 will be further discussed in detail below.

The display device DD may include a cover CVP (e.g., first cover) disposed below the third casing CS3. That is, the cover CVP faces the display module DM with the third casing CS3 therebetween. The cover CVP may be connected to the first casing CS1 and/or the second casing CS2. The cover CVP may be movable together with the casing CS in folding and/or unfolding of the display device DD. The cover CVP may be extendable out of and retractable into the first casing CS1. That is, a dimension or size of a portion of the cover CVP which is outside the first casing CS1 is variable based on folding and/or unfolding of the display device DD. A configuration of the cover CVP will be further discussed in detail below.

Figure 7:
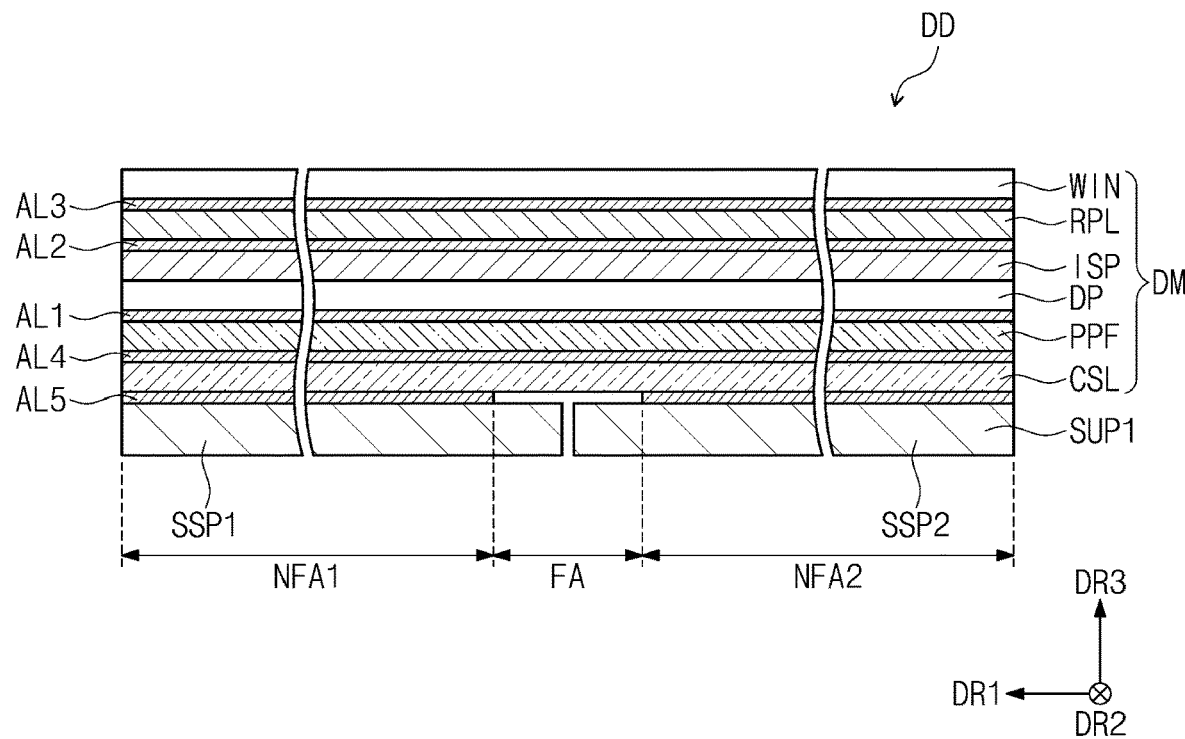
FIG. 7 illustrates a cross-sectional view showing an embodiment of a display module depicted in FIG. 3.

FIG. 7 illustrates a cross-sectional view showing an embodiment of the display module DM depicted in FIG. 3.

Referring to FIG. 7, the display device DD may include a display module DM and a first supporter SUP1 which is below the display module DM along the thickness direction (e.g., furthest from the display surface DS). The display module DM may include a display panel DP, an input sensing part ISP (e.g., input sensing layer), an antireflection layer RPL, a window WIN, a panel protection film PPF (e.g., panel protection layer), and a cushion layer CSL.

The display panel DP, the input sensing part ISP, the antireflection layer RPL and the window WIN may be disposed above the display panel DP, at a same first side thereof. The panel protection film PPF, the cushion layer CSL and the first supporter SUP1 may be disposed below the display panel DP, at a same second side thereof.

The display panel DP may be flexible. In an embodiment, for example, the display panel DP may include a plurality of electronic elements disposed on a flexible substrate. Likewise the display module DM, the display panel DP may include a first non-folding area NFA1, a second non-folding area NFA2, and a folding area FA disposed between the first non-folding area NFA1 and the second non-folding area NFA2.

The display panel DP may be emissive (e.g., self-emissive or light-generating), but is not limited thereto. In an embodiment, for example, the display panel DP may be an organic light emitting display panel or a quantum-dot light emitting display panel. An emission layer EML (e.g., light emission layer) of the organic light emitting display panel may include an organic light emitting material. An emission layer EML of the quantum-dot light emitting display panel may include a quantum-dot or a quantum-rod. The following will describe an example in which an organic light emitting display panel is the display panel DP.

The input sensing part ISP may be disposed on the display panel DP. The input sensing part ISP may include a plurality of sensors (not shown) that detect an external input provided to the display device DD. The sensors may use a capacitive method to detect the external input. The input sensing part ISP may be directly on the display panel DP such as provided when the display module DM is manufactured, however, is not limited thereto. In an embodiment, when the display panel DP is provided or manufactured, the input sensing part ISP may be separately provided or formed as an input sensing panel and then attached to the display panel DP such as through an adhesive or other fixing member.

The antireflection layer RPL may be disposed on the input sensing part ISP. The antireflection layer RPL may face the display panel DP with the input sensing part ISP therebetween. The antireflection layer RPL may reduce or effectively prevent reflection of external light. The antireflection layer RPL may reduce a reflectance of external light that is incident toward the display panel DP from outside the display device DD. In an embodiment, for example, the antireflection layer RPL may include one or more of a retarder and a polarizer.

The window WIN may be disposed on the antireflection layer RPL. The window WIN may face the input sensing part ISP with the antireflection layer RPL therebetween. The window WIN may protect the display panel DP, the input sensing part ISP and the antireflection layer RPL against external scratches and impact from outside the display device DD. The window WIN may have optically transparent properties.

The panel protection film PPF may be disposed below the display panel DP. The panel protection film PPF may be defined as a protective substrate. The panel protection film PPF may protect a lower portion of the display panel DP. The panel protection film PPF may include a flexible plastic material. In an embodiment, for example, the panel protection film PPF may include polyethyleneterephthalate ("PET").

The cushion layer CSL may be disposed below the panel protection film PPF. The cushion layer CSL may face the display panel DP with the panel protection film PPF therebetween. The cushion layer CSL may absorb external impact applied to a lower portion of the display module DM, thereby protecting the display panel DP. The cushion layer CSL may include a resilient foam sheet.

The first supporter SUP1 may be disposed below the cushion layer CSL. The first supporter SUP1 corresponding to the cushion layer CSL may support the display module DM. The first supporter SUP1 may include a first sub-supporter SSP1 and a second sub-supporter SSP2 that are spaced apart from each other along the first direction DR1. The display device DD which is flat may dispose the first sub-supporter SSP1 and the second sub-supporter SSP2 spaced apart from and/or disconnected from each other along the first direction DR1. Referring to FIG. 7, the first sub-supporter SSP1 and the second sub-supporter SSP2 may be disconnected from each other at the folding area FA. The first sub-supporter SSP1 and the second sub-supporter SSP2 which are disconnected from each other define a gap or space therebetween, at the folding area FA. The first sub-supporter SSP1 and the second sub-supporter SSP2 which are disconnected from each other are disposed in a same plane as each other (e.g., coplanar with each other).

The first sub-supporter SSP1 may be disposed below and corresponding to the first non-folding area NFA1 of the display module DM, and in a plan view, may overlap the first non-folding area NFA1. The second sub-supporter SSP2 may be disposed below and corresponding to the second non-folding area NFA2 of the display module DM, and in the plan view, may overlap the second non-folding area NFA2. The first sub-supporter SSP1 may support the display device DD at the first non-folding area NFA1, and the second sub-supporter SSP2 may support the display device DD at the second non-folding area NFA2.

The first and second sub-supporters SSP1 and SSP2 may include a rigid material such as metal. In an embodiment, for example, the first and second sub-supporters SSP1 and SSP2 may include a stainless steel, aluminum or an alloy thereof. The first and second sub-supporters SSP1 and SSP2 may each have strength greater than that of the display panel DP. In an embodiment, the first and second sub-supporters SSP1 and SSP2 may each be more rigid, less deformable or flexible, etc. than the display panel DP, to have the greater strength noted above.

A first adhesive layer AL1 may be disposed between the display panel DP and the panel protection film PPF. The first adhesive layer AL1 may attach the display panel DP to the panel protection film PPF.

A second adhesive layer AL2 may be disposed between the antireflection layer RPL and the input sensing part ISP. The second adhesive layer AL2 may attach the antireflection layer RPL to the input sensing part ISP.

A third adhesive layer AL3 may be disposed between the window WIN and the antireflection layer RPL. The third adhesive layer AL3 may attach the window WIN to the antireflection layer RPL.

A fourth adhesive layer AL4 may be disposed between the panel protection film PPF and the cushion layer CSL. The fourth adhesive layer AL4 may attach the panel protection film PPF to the cushion layer CSL.

A fifth adhesive layer AL5 may be disposed between the cushion layer CSL and the first supporter SUP1. The fifth adhesive layer AL5 may attach the cushion layer CSL to the first supporter SUP1. In the plan view, at the folding area FA, the fifth adhesive layer AL5 may be absent between the cushion layer CSL and the first supporter SUP1. That is, the fifth adhesive layer AL5 is disconnected at the folding area FA, to define a first portion and a second portion of the fifth adhesive layer AL5 respectively corresponding to the first sub-supporter SSP1 and the second sub-supporter SSP2. The first portion and the second portion of the fifth adhesive layer AL5 which are disconnected from each other are disposed in a same plane as each other (e.g., coplanar with each other). The fifth adhesive layer AL5 which is disconnected defines a gap or space between the first portion and the second portion of the fifth adhesive layer AL5 and between the cushion layer CSL and the first supporter SUP1 facing each other.

When the fifth adhesive layer AL5 is disposed between the cushion layer CSL and the first supporter SUP1 at the folding area FA, the first supporter SUP1 may be attached to the cushion layer CSL at the folding area FA. While the display module DM having flexibility is bendable at the folding area FA, bending of the first supporter SUP1 including metal and having strength greater than the display module DM may be restricted or difficult.

Where the first supporter SUP1 may be attached to the cushion layer CSL at the folding area FA, components or layers may not be bendable at the folding area FA by folding of the display module DM, since the first and second sub-supporters SSP1 and SSP2 each has a strength greater than that of the display module DM. In one or more embodiment, to facilitate bending of components or layers at the folding area FA, the fifth adhesive layer AL5 is omitted from a portion of the folding area FA.

Figure 8:
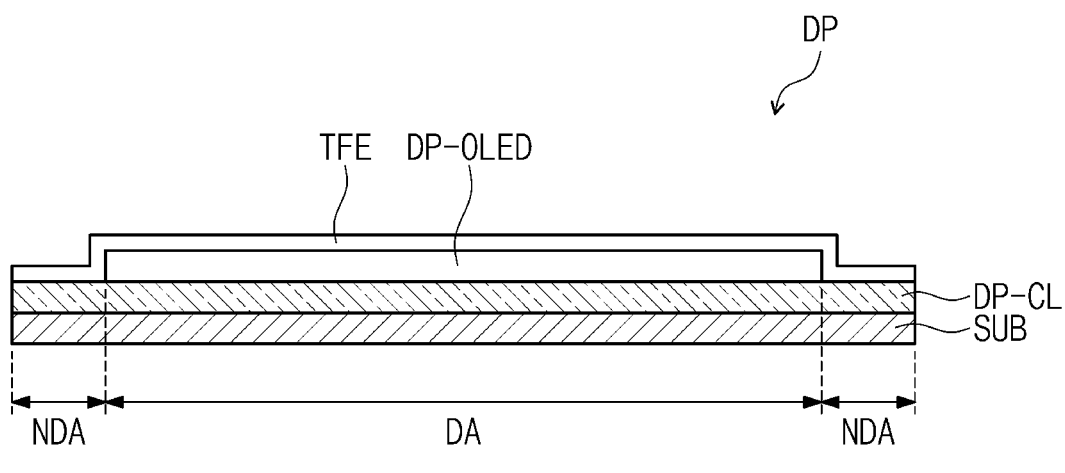
FIG. 8 illustrates a cross-sectional view showing an embodiment of a display panel depicted in FIG. 7.

FIG. 8 illustrates a cross-sectional view showing an embodiment of the display panel DP depicted in FIG. 7.

Referring to FIG. 8, the display panel DP may include a substrate SUB, a circuit element layer DP-CL disposed on the substrate SUB, a display element layer DP-OLED disposed on the circuit element layer DP-CL, and a thin-film encapsulation layer TFE (e.g., encapsulation layer) disposed on the display element layer DP-OLED.

The substrate SUB may include a display area DA and a non-display area NDA which is adjacent to the display area DA. The substrate SUB may include a flexible plastic material. In an embodiment, for example, the substrate SUB may include polyimide ("PI").

The display element layer DP-OLED may be disposed on the display area DA. The thin-film encapsulation layer TFE may be disposed on the circuit element layer DP-CL to cover the display element layer DP-OLED. The thin-film encapsulation layer TFE may face the substrate SUB with both the circuit element layer DP-CL and the display element layer DP-OLED therebetween.

A plurality of pixels PX may be disposed on or defined in the circuit element layer DP-CL and the display element layer DP-OLED. Each pixel PX may include a transistor TR disposed in the circuit element layer DP-CL, and may also include a light emitting element OLED disposed in the display element layer DP-OLED and connected to a corresponding one of the transistor TR. A configuration of the pixel PX will be further discussed in detail below.

The thin-film encapsulation layer TFE may include at least two inorganic layers, and an organic layer that is disposed between the inorganic layers. The inorganic layers may include an inorganic material, and may protect the pixels PX against moisture and/or oxygen. The organic layer may include an organic material, and may protect the pixels PX against foreign substances such as dust particles.

The input sensing part ISP (FIG. 7) may be in direct contact with the thin-film encapsulation layer TFE of the display panel DP (e.g., may form an interface therebetween). In an embodiment, for example, since the input sensing part ISP is provided directly on the display panel DP, at least one dielectric layer (not shown) of the input sensing part ISP may be in direct contact with the thin-film encapsulation layer TFE of the display panel DP. The at least one dielectric layer may include one or more of an inorganic material and an organic material.

Within the input sensing part ISP, a first conductive layer (not shown) may be disposed on the dielectric layer. When the dielectric layer is provided in plural, the first conductive layer may be disposed directly on an uppermost one of the plurality of dielectric layers. A second conductive layer may be disposed on the first conductive layer. The first and second conductive layers within the input sensing part ISP may define a plurality of sensors (not shown) for detecting an external input.

Figure 9:
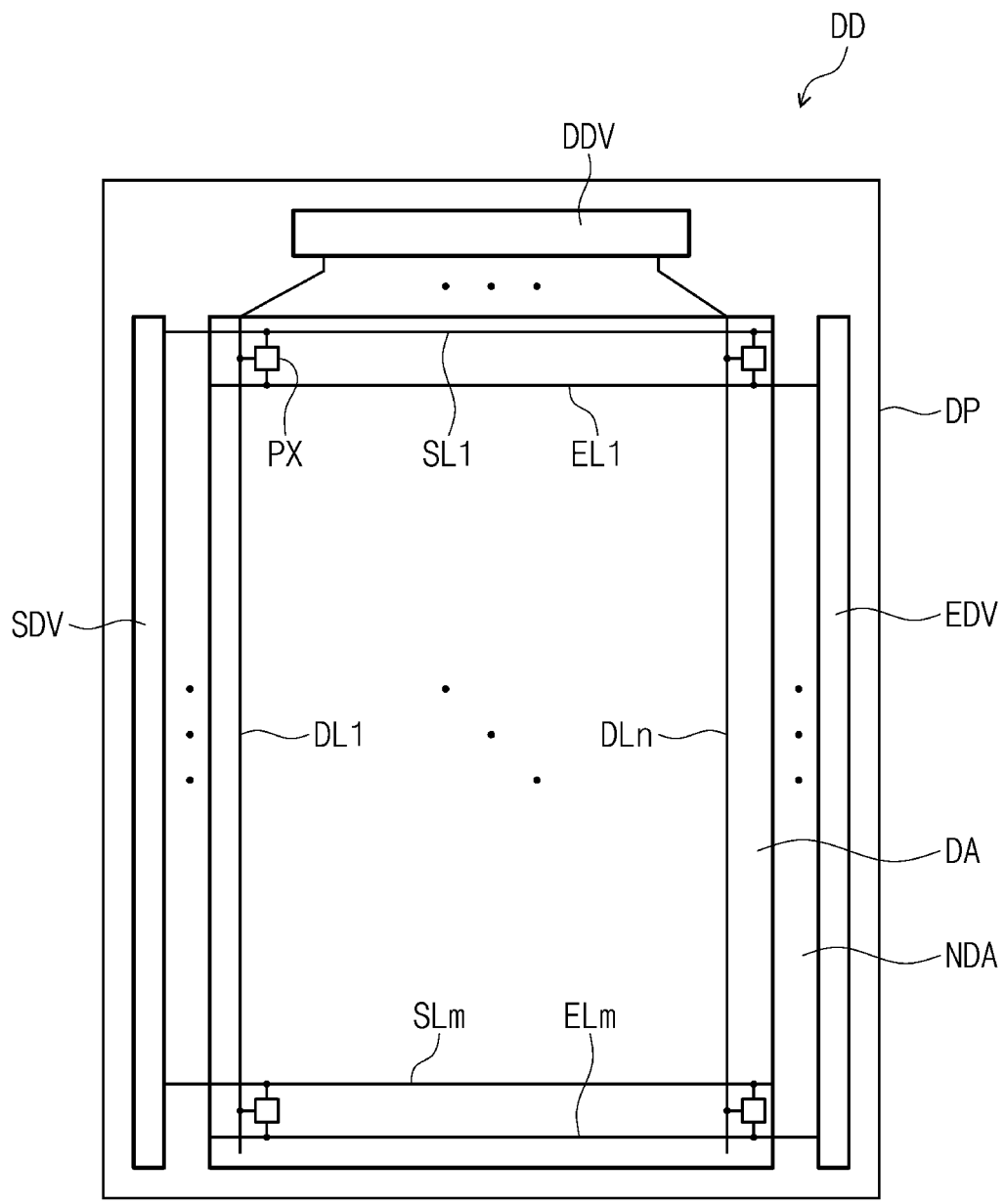
FIG. 9 illustrates a plan view showing an embodiment of a display panel depicted in FIG. 7.

FIG. 9 illustrates a plan view showing an embodiment of the display panel DP depicted in FIG. 7. For convenience of illustration, the window WIN, the antireflection layer RPL and the input sensing part ISP are omitted in the plan view of FIG. 9.

Referring to FIG. 9, the display device DD may include a display panel DP, a scan driver SDV, a data driver DDV and an emission driver EDV. The scan driver SDV, the data driver DDV and the emission driver EDV may be disposed on the display panel DP.

The display panel DP may have a rectangular shape defined by long sides that extend along the first direction DR1 and short sides that extend along the second direction DR2. The display panel DP may include a display area DA and a non-display area NDA that is adjacent to the display area DA.

The display panel DP may include a pixel PX provided in plural (e.g., a plurality of pixels PX), a scan line provided in plural including a plurality of scan lines SL1 to SLm, a data line provided in plural including a plurality of data lines DL1 to DLn, and an emission line provided in plural including a plurality of emission lines EL1 to ELm. The subscripts "m" and "n" are natural numbers. The pixels PX may be disposed in the display area DA and connected to corresponding ones among the scan lines SL1 to SLm, the data lines DL1 to DLn and the emission lines EL1 to ELm.

The scan driver SDV, the data driver DDV and the emission driver EDV may be disposed on the non-display area NDA. The scan driver SDV and the emission driver EDV may be disposed corresponding to long sides of the display panel DP. The data driver DDV may be include an integrated circuit chip and may be disposed corresponding to one of the short sides of the display panel DP.

The scan lines SL1 to SLm may extend along the second direction DR2 and may be connected to the scan driver SDV. The data lines DL1 to DLn may extend along the first direction DR1 and may be connected to the data driver DDV. The emission lines EL1 to ELm may extend along the second direction DR2 and may be connected to the emission driver EDV.

The scan driver SDV may generate an electrical signal in plural including a plurality of scan signals, and the scan signals may be applied through the scan lines SL1 to SLm to the pixels PX. The scan signals may be sequentially applied to the pixels PX. The data driver DDV may generate an electrical signal in plural including a plurality of data voltages, and the data voltages may be applied through the data lines DL1 to DLn to the pixels PX. The emission driver EDV may generate an electrical signal in plural including a plurality of light emission signals, and the light emission signals may be applied through the emission lines EL1 to ELm to the pixels PX.

Although not shown, the display device DD may further include a timing controller (not shown) that controls operation of the scan driver SDV, the data driver DDV and/or the emission driver EDV.

In response to the scan signals, the data voltages may be provided to the pixels PX. In response to the emission signals, the pixels PX may generate and/or emit light having a brightness which corresponds to the data voltage, thereby displaying an image IM. The light emission signals may control light emission timing of the pixels PX.

Figure 10:
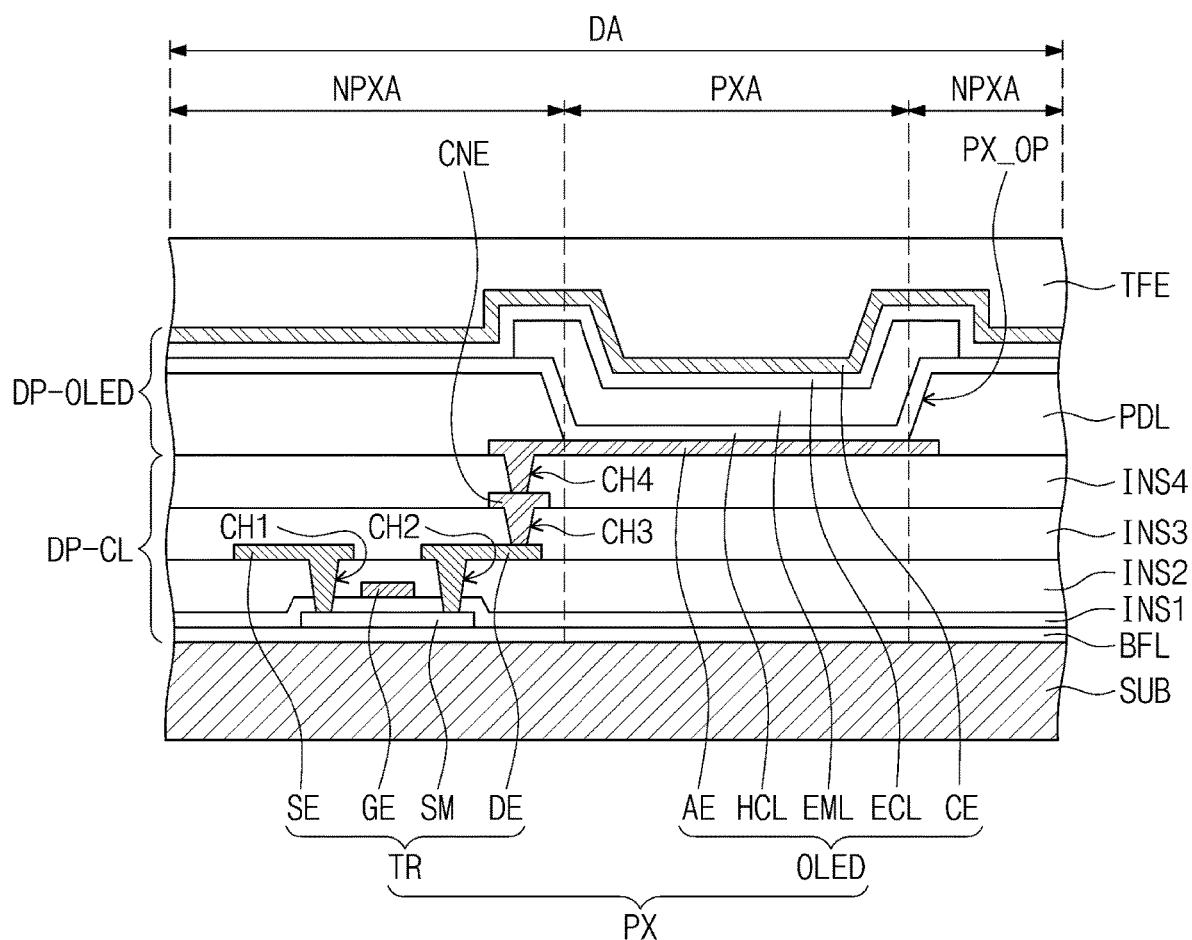
FIG. 10 illustrates a cross-sectional view showing an embodiment of a pixel depicted in FIG. 9.

FIG. 10 illustrates a cross-sectional view showing an embodiment of a pixel PX depicted in FIG. 9.

Referring to FIG. 10, the pixel PX may include a light emitting element OLED and a transistor TR which is connected to the light emitting element OLED. The light emitting element OLED may include a first electrode AE, a second electrode CE facing the first electrode AE, a hole control layer HCL, an electron control layer ECL, and an emission layer EML. The first electrode AE may be an anode electrode, and the second electrode CE may be a cathode electrode. The light emitting element OLED may be defined as an organic light emitting element.

The transistor TR and the light emitting element OLED may be disposed on the substrate SUB. The display area DA may include a light emitting area PXA that corresponds to a pixel PX and a non-light emitting area NPXA which is adjacent to the light emitting area PXA. The light emitting element OLED may be disposed in or correspond to the light emitting area PXA, and the transistor TR may be disposed in or correspond to the non-light emitting area NPXA. The light emitting area PXA may be a planar area (e.g., defined by dimensions along the first direction DR1 and the second direction DR2) at which light is emitted from the pixel PX. The non-light emitting area NPXA may be a planar area at which light is not emitted from the pixel PX.

A buffer layer BFL may be disposed on the substrate SUB, and the buffer layer BFL may include an inorganic material. A semiconductor layer SM of the transistor TR may be disposed on the buffer layer BFL. The semiconductor layer SM may include an organic semiconductor material or an inorganic semiconductor material such as amorphous silicon or polycrystalline silicon. In addition, the semiconductor layer SM may include an oxide semiconductor material.

Although not shown in FIG. 10, the semiconductor layer SM may include or define a source region, a drain region, and a channel region which is between the source and drain regions.

A first dielectric layer INS1 may be disposed on the buffer layer BFL, and the first dielectric layer INS1 may cover the semiconductor layer SM. The first dielectric layer INS1 may include an inorganic material, and may be considered a first insulating layer. A gate electrode GE of the transistor TR may be disposed on the first dielectric layer INS1, and the gate electrode GE may overlap or correspond to the semiconductor layer SM. The gate electrode GE may be disposed to overlap or correspond to the channel region of the semiconductor layer SM.

A second dielectric layer INS2 may be disposed on the first dielectric layer INS1, and the second dielectric layer INS2 may cover the gate electrode GE. The second dielectric layer INS2 may include one or more of an organic material and an inorganic material, and may be considered a second insulating layer.

A source electrode SE and a drain electrode DE of the transistor TR may be disposed spaced apart from each other along the second dielectric layer INS2 or along the substrate SUB. The source electrode SE may be connected to the source region of the semiconductor layer SM at or through a first contact hole CH1 defined in the first and second dielectric layers INS1 and INK. The drain electrode DE may be connected to the drain region of the semiconductor layer SM at or through a second contact hole CH2 defined in the first and second dielectric layers INS1 and INS2.

A third dielectric layer INS3 may be disposed on the second dielectric layer INS2, and the third dielectric layer INS3 may cover both of the source and drain electrodes SE and DE of the transistor TR. The third dielectric layer INS3 may include an organic material, and may be considered a third insulating layer. A connection electrode CNE may be disposed on the third dielectric layer INS3. The connection electrode CNE may be connected to the drain electrode DE at or through a third contact hole CH3 defined in the third dielectric layer INS3.

A fourth dielectric layer INS4 may be disposed on the third dielectric layer INS3, and the fourth dielectric layer INS4 may cover the connection electrode CNE. The first electrode AE may be disposed on the fourth dielectric layer INS4. The first electrode AE may be connected to the connection electrode CNE at or through a fourth contact hole CH4 defined in the fourth dielectric layer INS4.

A pixel definition layer PDL may be disposed on the first electrode AE and the fourth dielectric layer INS4, and the pixel definition layer PDL may expose a portion of the first electrode AE. The pixel definition layer PDL may have or define an opening PX_OP that exposes a portion of the first electrode AE to outside the pixel definition layer PDL.

The hole control layer HCL may be disposed on the first electrode AE and the pixel definition layer PDL. The hole control layer HCL may be commonly disposed in both the light emitting area PXA and the non-light emitting area NPXA. The hole control layer HCL may include a hole transport layer and may further include a hole injection layer.

The emission layer EML may be disposed on the hole control layer HCL. The emission layer EML may be disposed in a region that corresponds to the opening PX_OP. In an embodiment, for example, the emission layer EML may be provided or formed corresponding to each of the pixels PX. The emission layer EML may include one or more of an organic light emitting material and an inorganic light emitting material. The emission layer EML may generate a colored light such as one of a red light, a green light and a blue light, however, is not limited thereto. The emission layer EML may generate a white light from a combination of organic materials that produce red, green and blue colored lights.

The electron control layer ECL may be disposed on the emission layer EML. The electron control layer ECL may be disposed on the hole control layer HCL, thereby covering the emission layer EML. In an embodiment, for example, the electron control layer ECL may be commonly disposed in both the light emitting area PXA and the non-light emitting area NPXA. The electron control layer ECL may include an electron transport layer and may further include an electron injection layer.

The second electrode CE may be disposed on the electron control layer ECL. The second electrode CE may be commonly disposed for a plurality of the pixels PX. The thin-film encapsulation layer TFE may be disposed on the second electrode CE. The thin-film encapsulation layer TFE and the substrate SUB may for outer surfaces or outermost layers of the display panel DP, without being limited thereto.

The circuit element layer DP-CL may be defined by layers between and inclusive of the buffer layer BFL and the fourth dielectric layer INS4. The display element layer DP-OLED may be defined by layers between and inclusive of the first electrode AE and the second electrode CE.

The first electrode AE may be supplied with a first voltage, and the second electrode CE may be supplied with a second voltage which is less than the first voltage. Holes and electrons injected into the emission layer EML may combine with each other to produce excitons, and the light emitting element OLED may emit light as the excitons return to ground state. The light emitting element OLED may emit light to display an image IM.

Figure 11:
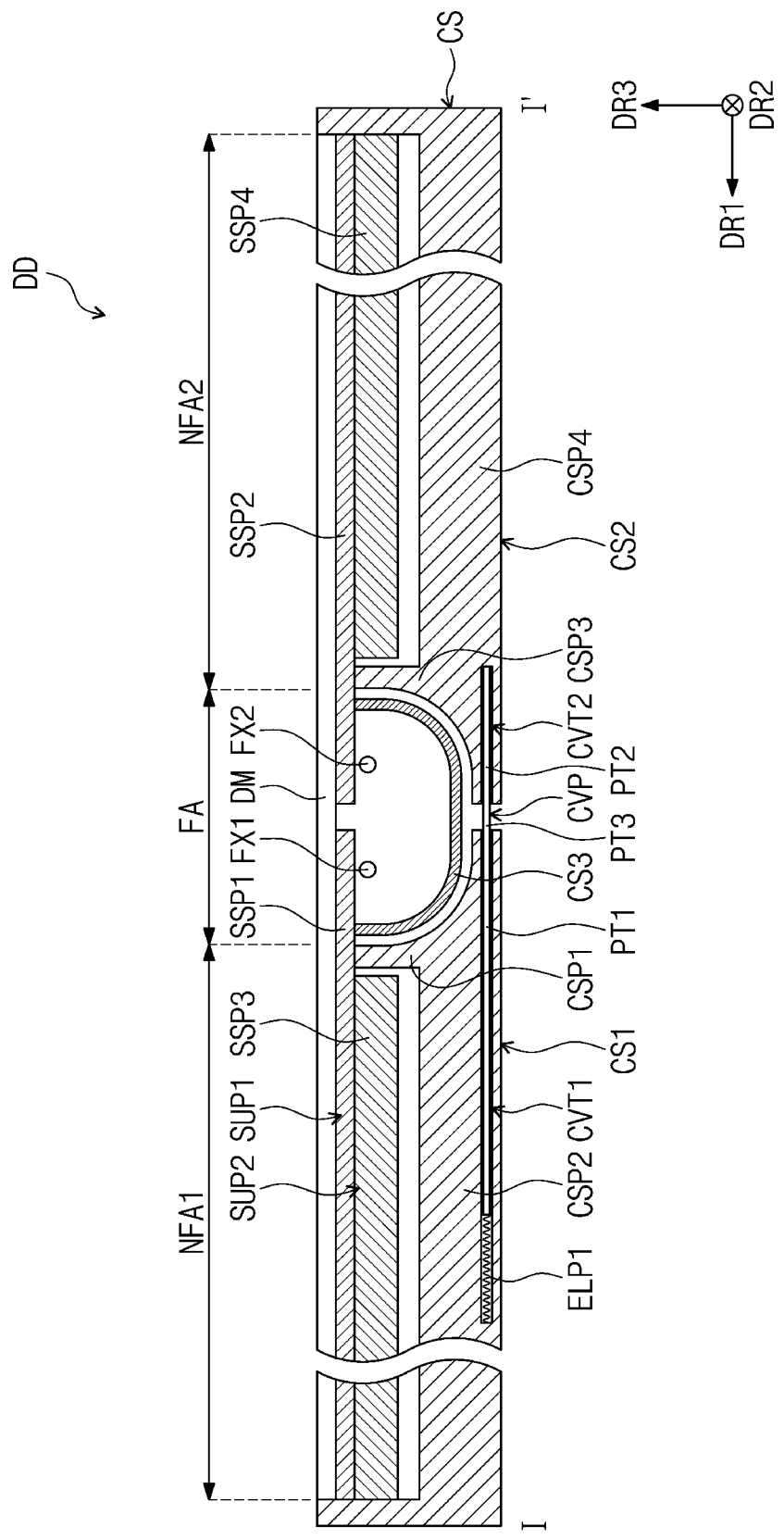
FIG. 11 illustrates a cross-sectional view showing an embodiment of the display device taken along line I-I' of FIG. 3.
Figure 12:
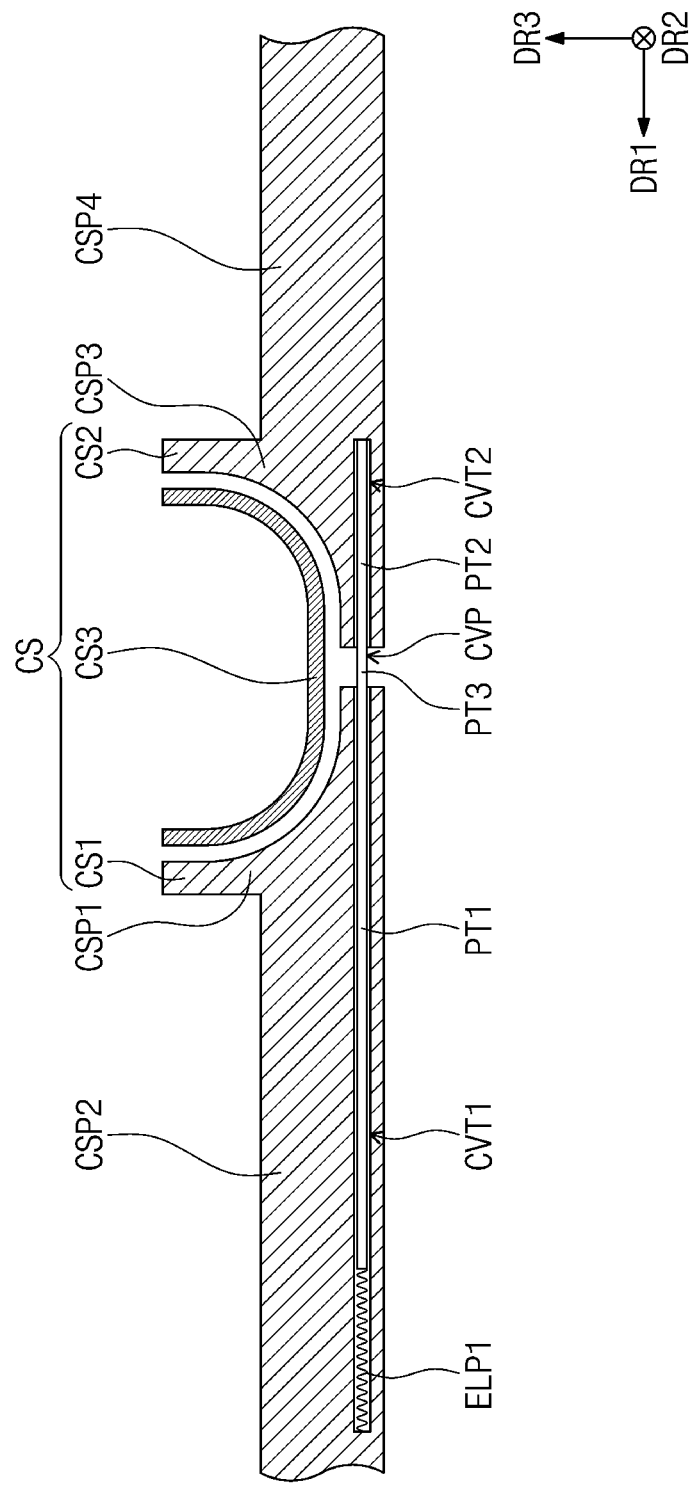
FIG. 12 illustrates an enlarged cross-sectional view showing an embodiment of a casing depicted in FIG. 11.

FIG. 11 illustrates a cross-sectional view showing an embodiment of the display device DD taken along line I-I' of FIG. 3. FIG. 12 illustrates an enlarged cross-sectional view showing an embodiment of the casing CS depicted in FIG. 11.

FIG. 12 exemplarily shows an enlarged cross-sectional view of the cover CVP, the third casing CS3, the first casing CS1 in which a portion of the cover CVP is disposed, and the second casing CS2 in which a portion of the cover CVP is disposed.

Referring to FIGS. 11 and 12, the first casing CS1 and the second casing CS2 may be disposed below the display module DM and may be spaced apart from each other along the first direction DR1. The display device DD which is flat or unfolded, disposes the first casing CS1 and the second casing CS2 spaced apart from each other along the first direction DR1, at the folding area FA. The third casing CS3 may be disposed between the first casing CS1 and the second casing CS2.

The first non-folding area NFA1 may correspond to the first casing CS1, and in the plan view, may overlap the first casing CS1, along the thickness direction. The second non-folding area NFA2 may correspond to the second casing CS2, and in the plan view, may overlap the second casing CS2, along the thickness direction. The folding area FA may correspond to the third casing CS3, and in the plan view, may overlap the third casing CS3, along the thickness direction.

The first sub-supporter SSP1 may be disposed between the first casing CS1 and the first non-folding area NFA1 of the display module DM. The second sub-supporter SSP2 may be disposed between the second casing CS2 and the second non-folding area NFA2 of the display module DM. The first and second folding axes FX1 and FX2 may be defined respectively below the first and second sub-supporters SSP1 and SSP2, while corresponding to the folding area FA.

The display device DD may further include a second supporter SUP2 disposed below the first supporter SUP1. That is, the second supporter SUP2 faces the display module DM with the first supporter SUP1 therebetween. The second supporter SUP2 may include a third sub-supporter SSP3 and a fourth sub-supporter SSP4 that are spaced apart from each other along the first direction DR1. The display device DD which is flat or unfolded, disposes the first and second sub-supporters SSP1 and SSP2 respectively extended further than inner ends of the third and fourth sub-supporters SSP3 and SSP4. That is, the first and second sub-supporters SSP1 and SSP2 in the non-display areas each extend into the folding area FA to define an extended portion.

The third sub-supporter SSP3 may be disposed between the first casing CS1 and the first sub-supporter SSP1, while overlapping the first non-folding area NFA1 of the display module DM. The fourth sub-supporter SSP4 may be disposed between the second casing CS2 and the second sub-supporter SSP2, while overlapping the second non-folding area NFA2 of the display module DM. The third sub-supporter SSP3 may support the first non-folding area NFA1 of the display module DM. The fourth sub-supporter SSP4 may support the second non-folding area NFA2 of the display module DM.

The third and fourth sub-supporters SSP3 and SSP4 may include metal. In an embodiment, for example, the third and fourth sub-supporters SSP3 and SSP4 may include a stainless steel, aluminum or an alloy thereof. The third and fourth sub-supporters SSP3 and SSP4 may each have strength greater than that of the display panel DP. As similarly described above for the first and second sub-supporters SSP1 and SSP2, in an embodiment the third and fourth sub-supporters SSP3 and SSP4 may each be more rigid, less deformable or flexible, etc. than the display panel DP, to have the greater strength noted above.

The third casing CS3 may include a bottom surface which faces away from the display module DM, and a top surface which is opposite to the bottom surfaces and faces the display module DM. The third casing CS3 may have the bottom surface that is convexly curved downwardly in a direction away from the display module DM. The third casing CS3 may have the top surface that is concavely curved downwardly in the direction away from the display module DM. Therefore, an accommodation space may be defined by the top surface of the third casing CS3. The third casing CS3 may be open upwardly in a direction toward the display module DM to define the accommodation space.

The first casing CS1 may include a first casing part CSP1 (e.g., first casing portion) and a second casing part CSP2 (e.g., second casing portion). The first casing part CSP1 may extend along or surround a portion of the bottom surface of the third casing CS3, such portion being adjacent to or corresponding to the first casing CS1. In addition, the first casing part CSP1 may protrude upwardly to be disposed below the first sub-supporter SSP1 and may support the first sub-supporter SSP1. A protruded portion of the first casing part CSP1 may be between the third sub-supporter SSP3 and the third casing CS3. The second casing part CSP2 of the first casing CS1 may extend in the first direction DR1 from the first casing part CSP1 and may be disposed below or corresponding to the third sub-supporter SSP3. The second casing part CSP2 may protrude upwardly to face a side surface of one or more of the third sub-supporter SSP3, the first sub-supporter SSP1 and the display module DM.

The second casing CS2 may include a third casing part CSP3 (e.g., third casing portion) and a fourth casing part CSP4 (e.g., fourth casing portion). The third casing part CSP3 may extend along or surround a portion of the bottom surface of the third casing CS3, such portion being adjacent to or corresponding to the second casing CS2. In addition, the third casing part CSP3 may protrude upwardly to be disposed below the second sub-supporter SSP2 and may support the second sub-supporter SSP2. A protruded portion of the second casing part CSP2 may be between the fourth sub-supporter SSP4 and the third casing CS3. The fourth casing part CSP4 of the second casing CS2 may extend along the first direction DR1 from the third casing part CSP3 and may be disposed below or corresponding to the fourth sub-supporter SSP4. The fourth casing part CSP4 may protrude upwardly to face a side surface of one or more of the fourth sub-supporter SSP4, the second sub-supporter SSP2 and the display module DM.

The third sub-supporter SSP3 may be spaced apart in the first direction DR1 from the first casing part CSP1 and may be disposed below the first sub-supporter SSP1. The fourth sub-supporter SSP4 may be spaced apart in the first direction DR1 from the third casing part CSP3 and may be disposed below the second sub-supporter SSP2.

The cover CVP may be disposed below the third casing CS3. That is, the display device DD which is flat or unfolded, disposes the cover CVP facing the display module DM with the third casing CS3 therebetween. The cover CVP may be connected to the first casing CS1 and the second casing CS2. The cover CVP is movable with respect to the first casing CS1 and the second casing CS2, such as being extendable out of and retractable into the first casing CS1. The cover CVP may be fixedly connected to the casing CS at the second casing CS2.

The first casing CS1 may have or define a first cavity CVT1 that extends along the first direction DR1. The second casing CS2 may have a second cavity CVT2 that extends along the first direction DR1. The first cavity CVT1 may have a length along the first direction DR1 which is greater than a length along the first direction DR1 of the second cavity CVT2.

The first casing CS1 may have a first inner side that faces the second casing CS2, the first cavity CVT1 may be open at the first inner side of the first casing CS1 and the first cavity CVT1 may extend from the first inner side in the first direction DR1. The second casing CS2 may have a second inner side that faces the first casing CS1, the second cavity CVT2 may be open at the second inner side of the second casing CS2 and may extend from the second inner side in a direction opposite to the first direction DR1. Referring to FIG. 11, the display device DD which is flat or unfolded, may dispose the first cavity CVT1 and the second cavity CVT2 coplanar with each other, without being limited thereto.

The cover CVP may have a first portion disposed in the first cavity CVT1, and the first portion of the cover CVP may being extendable out of and retractable into the first cavity CVT1. In detail, a first end of the cover CVP which is defined by an end of the first portion of the cover CVP is movable within the first cavity CVT1, along the first direction DR1 such that the first portion of the cover CVP is extendable out of and retractable into the first cavity CVT1.

The cover CVP may have a second portion disposed in the second cavity CVT2. The second portion of the cover CVP may be fixedly connected to the second casing CS2. In detail, a second end of the cover CVP which is defined by an end of the second portion of the cover CVP is not movable within the second cavity CVT2, along the first direction DR1, to have a fixed position within the second cavity CVT2. That is, the cover CVP includes an end at the second casing CS2, and a position of the end of the cover CVP is fixed relative to the second casing CS2.

The cover CVP may include a first part PT1 (e.g., first cover portion or first portion), a second part PT2 (e.g., second cover portion or second portion) and a third part PT3 (e.g., third cover portion or third portion). The first part PT1 may be disposed in the first cavity CVT1, and the second part PT2 which is opposite to the first part PT1 may be disposed in the second cavity CVT2. The third part PT3 may not be disposed in the first cavity CVT1 or in the second cavity CVT2. The third part PT3 may be disposed below the third casing CS3, and between the first and second casings CS1 and CS2. That is, the third part PT3 is outside of both the first cavity CVT1 and the second cavity CVT2. In an embodiment, the cover CVP includes the third part PT3 connecting the first part PT1 to the second part PT2, the third part PT3 being outside of both of the first casing CS1 and the second casing CS2.

The first part PT1 may be extendable out of and retractable into the first cavity CVT1. To allow extension and retraction of the first part PT1, the display device DD may further include a first elastic member ELP1 that extends along the first direction DR1 and is disposed in the first cavity CVT1.

The first elastic member ELP1 may be disposed at a distal end of the first cavity CVT1 which is furthest from the second cavity CVT2, and connected to both the first casing CS1 and the first part PT1 of the cover CVP. The first elastic member ELP1 may have a first end connected to the first casing CS1 at the distal end of the first cavity CVT1, and may also have a second end opposite to the first end and connected to a distal end of the first part PT1 which is furthest from the second part PT2. The first elastic member ELP1 may have elasticity to permit expansion (e.g., elongation) and/or contraction thereof along the first direction DR1, and thus the first part PT1 may be extendable out of and retractable into the first cavity CVT1 by respective elongation and contraction of the first elastic member ELP1.

The second part PT2 may be fixedly connected to the second casing CS2 at a distal end of the second cavity CVT2 which is furthest from the first cavity CVT1. The third part PT3 of the cover CVP may be externally exposed to outside both the first cavity CVT1 and the second cavity CVT2. The third casing CS3 may have a lower portion that is not covered with the first casing CS1 or the second casing CS2, and the third part PT3 may cover the lower portion of the third casing CS3.

The cover CVP may include a resilient metal, where resilient indicates having high yield strengths, low moduli of elasticity, absorbing energy when deformed elastically, releasing that energy upon unloading, etc. The cover CVP may be a metallic sheet, however, is not limited thereto. In an embodiment, the cover CVP may include a resilient plastic material.

It is exemplarily illustrated that the cover CVP is fixed to the second casing CS2 and is extendable out of and retractable into the first casing CS1, but is not limited thereto. In an embodiment, for example, the display device DD may include the cover CVP fixedly connected to the first casing CS1 and being extendable out of and retractable into the second casing CS2.

Figure 13:
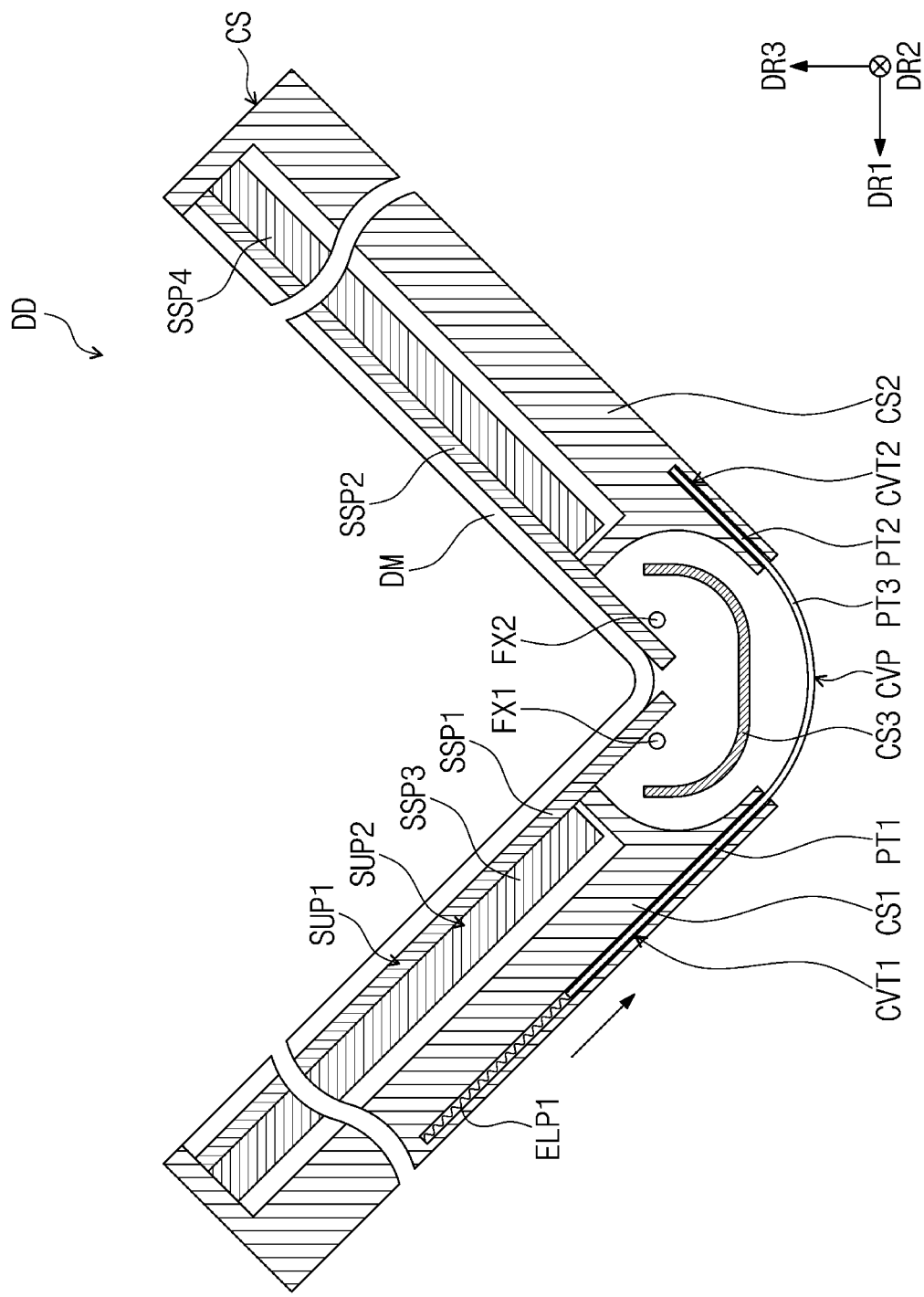
FIGS. 13 and 14 illustrate cross-sectional views showing embodiments of the display device depicted in FIG. 11 which is folded.
Figure 14:
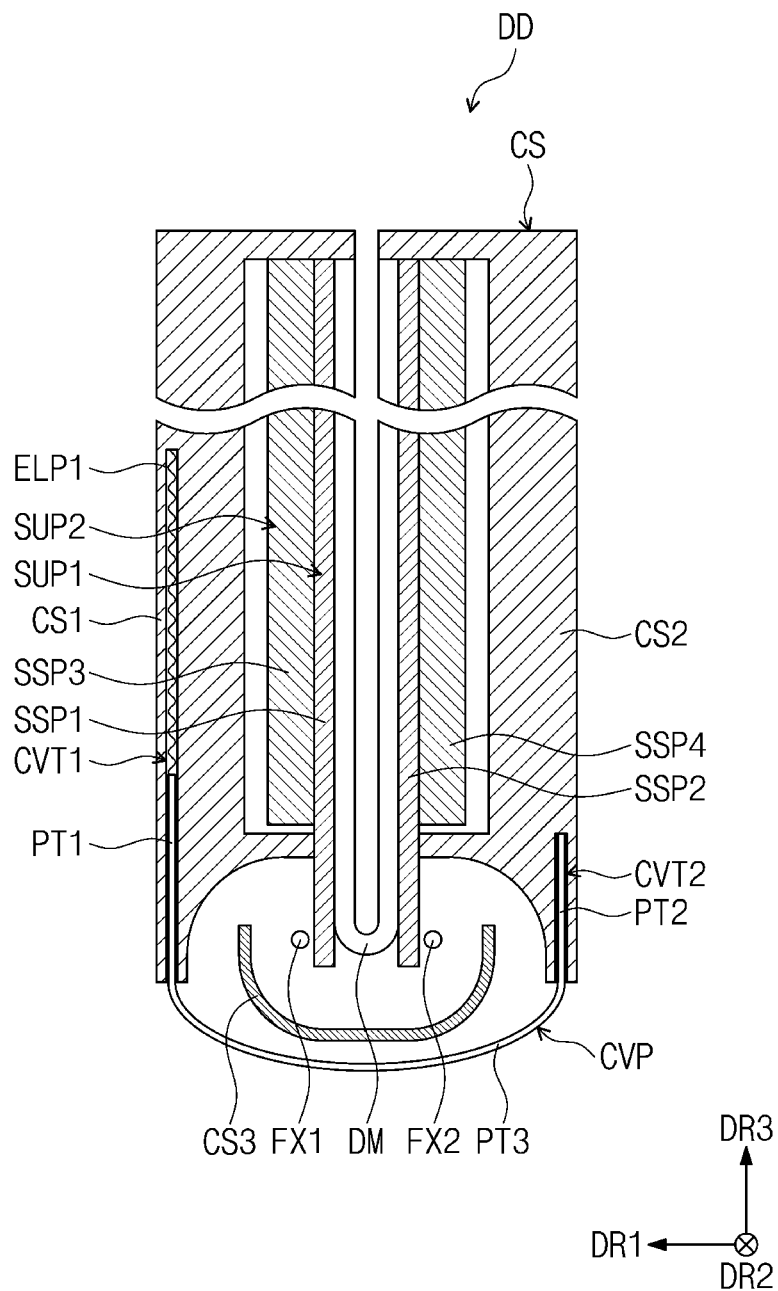

FIGS. 13 and 14 illustrate cross-sectional views showing the display device DD depicted in FIG. 11, which is partially folded and completely folded.

Referring to FIGS. 13 and 14, the display device DD may be foldable by rotation of the display device DD and components thereof about the first folding axis FX1 and/or the second folding axis FX2. Folding of the display device DD rotates the first casing CS1 about the first folding axis FX1 and rotates the second casing CS2 about the second folding axis FX2. As a result, the display device DD at the folding area FA may become bent to fold the display module DM and components thereof at the folding area FA. The display device DD may be foldable inwards such that a top surface of the display device DD at the first non-folding area NFA1 faces a top surface of the display device DD at the second non-folding area NFA2. In an embodiment, the display panel DP includes a top surface at the first non-folding area NFA1 and a top surface at the second non-folding area NFA2, and the display device DD which is folded disposes the top surface at the first non-folding area NFA1 facing the top surface at the second non-folding area NFA2.

As discussed above, the first and second sub-supporters SSP1 and SSP2 in the non-display areas each extend into the folding area FA to define an extended portion. The extended portion of each of the first and second sub-supporters SSP1 and SSP2 in the display device DD which is flat or unfolded, defines a side surface (e.g., inner side surface) of the first and second sub-supporters SSP1 and SSP2 at the folding area FA. The side surfaces of the first and second sub-supporters SSP1 and SSP2 may face each other along the first direction DR1. The rotation of the first and second casings CS1 and CS2 may dispose the side surfaces of the first and second sub-supporters SSP1 and SSP2 within the accommodation space defined at the third casing CS3. That is, the display device DD which is flat or unfolded disposes the extended portion of the first and second sub-supporters SSP1 and SSP2 outside the accommodation space (FIG. 11) while the display device DD which is bent (FIG. 13) or completely folded (FIG. 14) disposes the extended portion of the first and second sub-supporters SSP1 and SSP2 inside the accommodation space (e.g., within the third casing CS3). The third casing CS3 which is curved and defining the accommodation space in the display device DD which is flat or unfolded (FIG. 11), may remain curved and defining the accommodation space in the display device DD which is folded (FIGS. 13 and 14). That is, a shape of the third casing CS3 may remain the same even in folding or unfolding of the display device DD, without being limited thereto.

The display device DD which is partially folded or completely folded disposes the first part PT1 of the cover CVP pulled outwardly from the first casing CS1, since the second part PT2 of the cover CVP is fixed in a position relative to the second casing CS2. Therefore, the first elastic member ELP1 may expand or elongate (shown with arrow along first casing CS1 in FIG. 13) to cause the first part PT1 of the cover CVP to be extended outside of the first cavity CVT1 of the first casing CS1.

Folding of the display device DD may increase a portion of the cover CVP which externally exposed between the first and second casings CS1 and CS2. Taking FIG. 11 together with FIGS. 13 and 15, the first part PT1 of the cover CVP which is in the first cavity CVT1 may be reduced while the third part PT3 of the cover CVP which is externally exposed from both the first and second cavities CVT1 and CVT2 may be increased. The increase in dimension (e.g., planar area, length, etc.) of the third part PT3 may cover a larger portion of a lower portion of the third casing CS3. Even during folding of the display device DD, the cover CVP may reduce or effectively prevent the third casing CS3 from being externally exposed to outside the display device DD at a space between the first casing CS1 and the second casing CS2 which is defined at the folding area FA.

The display device DD which is flat or unfolded as illustrated in FIG. 11, contracts the first elastic member ELP1 to retract the cover CVP into the first cavity CVT1 of the first casing CS1. That is, the first part PT1 of the cover CVP which is in the first cavity CVT1 may be increased while the third part PT3 of the cover CVP which is externally exposed from both the first and second cavities CVT1 and CVT2 may be decreased.

The display device DD which is flat or unfolded (FIG. 11) disposes spaces respectively between the first and third casings CS1 and CS3 and between the second and third casings CS2 and CS3. The display device DD which is bent or folded at the folding area FA increases dimensions of the spaces between the first and third casings CS1 and CS3 and between the second and third casings CS2 and CS3. That is, sizes of the spaces are variable by folding and unfolding of the display device DD. Foreign substances may be introduced through the spaces and into the display device DD. The cover CVP is disposed covering an outermost space which is defined between inner side surfaces of the first casing CS1 and the second casing CS2 and furthest from the display module DM.

The first casing CS1, the second casing CS2 and the cover CVP may each be movable relative to the third casing CS3. Referring to FIGS. 11 to 14, in folding or unfolding of the display device DD, the first casing part CSP1 may be movable along the bottom surface of the third casing CS3, where the bottom surface of the third casing CS3 faces an upper surface of the first casing part CSP1. Similarly, the third casing part CSP3 may be movable along the bottom surface of the third casing CS3, where the bottom surface of the third casing CS3 faces an upper surface of the third casing part CSP3. Similarly, the cover CVP may be movable along the bottom surface of the third casing CS3, where the bottom surface of the third casing CS3 faces an upper surface of the cover CVP.

In one or more embodiment, folding or unfolding of the display device DD may protrude the cover CVP from or retract the cover CVP in the first casing CS1. Therefore, the cover CVP may cover the third casing CS3, while changing the region externally exposed (e.g., a space) between the first casing CS1 and the second casing CS2. As a result, the third casing CS3 which is covered by the cover CVP which is extendable and retractable relative into the casing CS, may not be externally exposed to outside the display device DD.

In addition, as the cover CVP changes the portion thereof which is externally exposed out of the casing CS, the cover CVP may isolate the respective spaces between the first and third casings CS1 and CS3 and between the second and third casings CS2 and CS3. As a result, no foreign substances may be introduced into the display device DD at a region corresponding to the third casing CS3.

In consequence, the cover CVP may reduce or effectively prevent the introduction of foreign substances into the display device DD at the folding area FA.

Figure 15:
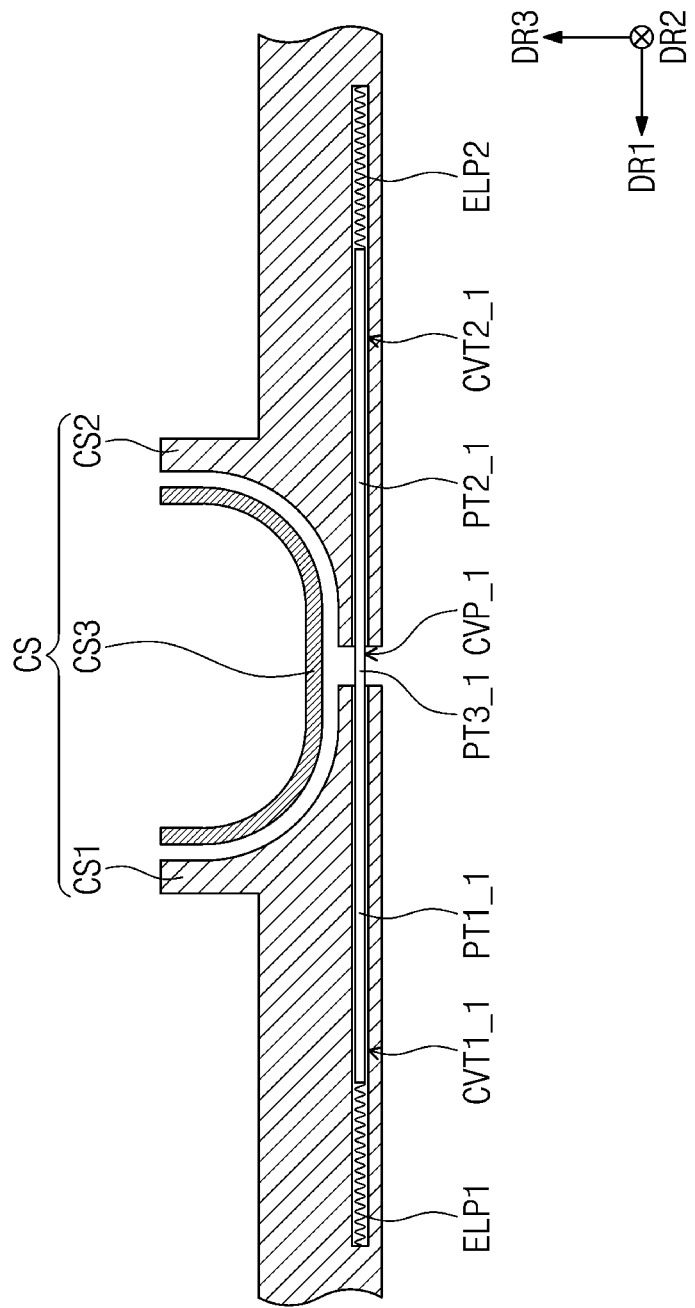
FIGS. 15 and 16 illustrate cross-sectional views showing embodiments of a cover.
Figure 16:
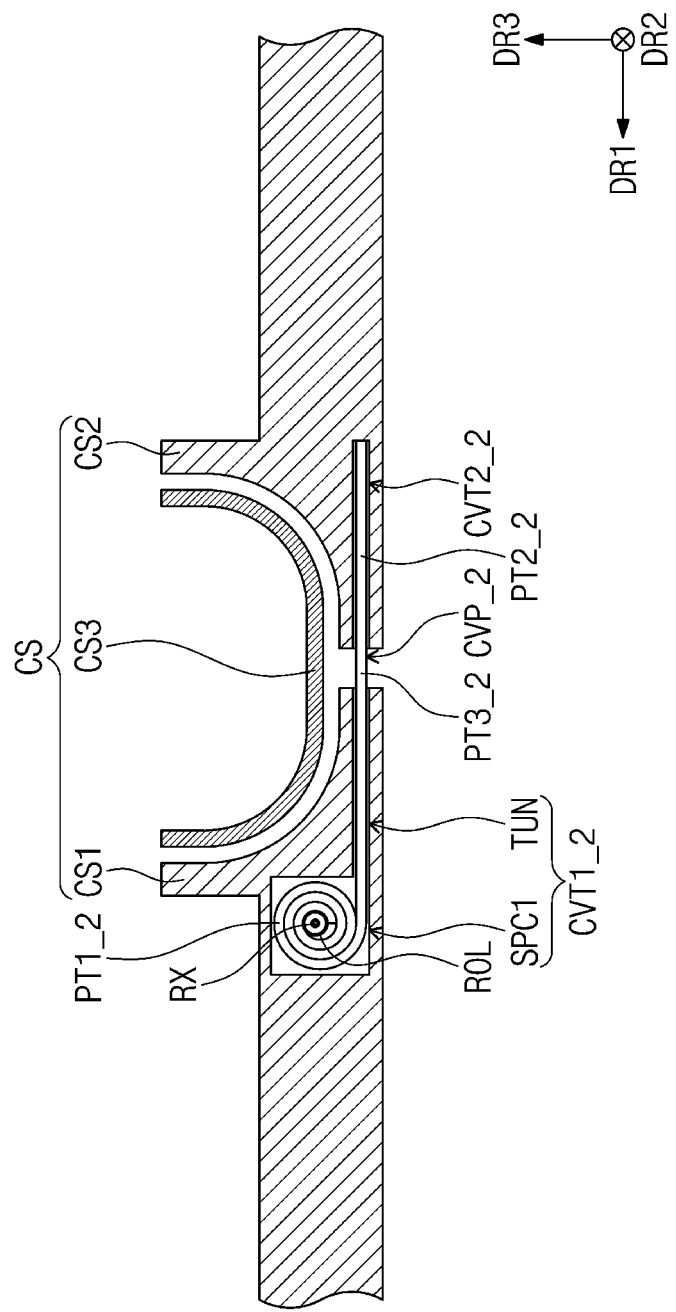

FIGS. 15 and 16 illustrate cross-sectional views showing embodiments of a cover CVP.

The following will focus on differences between second cover CVP_1 and third cover CVP_2 shown in FIGS. 15 and 16 the cover CVP illustrated in FIG. 12. FIGS. 15 and 16 exemplarily show the casing CS that corresponds to that shown in FIG. 12.

Referring to FIG. 15, the second cover CVP_1 may be disposed below the third casing CS3, and connected to each of the first casing CS1 and the second casing CS2. The second cover CVP_1 may be extendable out of and retractable into the first casing CS1. In addition, the second cover CVP_1 may be extendable out of and retractable into the second casing CS2.

The first casing CS1 may have a third cavity CVT1_1, and the second casing CS2 may have a fourth cavity CVT2_1. The third cavity CVT1_1 may have a length along the first direction DR1 the same as a length along the first direction DR1 of the fourth cavity CVT2_1.

The second cover CVP_1 may include a fourth part PT1_1 disposed in the third cavity CVT1_1, a fifth part PT2_1 disposed in the fourth cavity CVT2_1, and a sixth part PT3_1 disposed between the first casing CS1 and the second casing CS2.

The fourth part PT1_1 may extend out of and retract into the third cavity CVT1_1. To allow the extension and retraction of the fourth part PT1_1, a first elastic member ELP1 may be disposed at a distal end of the third cavity CVT1_1 and connected to both the first casing CS1 and the fourth part PT1_1. The first elastic member ELP1 may have elasticity to permit expansion or contraction thereof along the first direction DR1, and thus the fourth part PT1_1 may be extendable out of and retractable into the third cavity CVT1_1.

The fifth part PT2_1 may be extendable out of and retractable into the fourth cavity CVT2_1. A second elastic member ELP2 may be disposed at a distal end of the fourth cavity CVT2_1 which is furthest from the third cavity CVT1_1 and connected to both the second casing CS2 and the fifth part PT2_1. The second elastic member ELP2 may have elasticity to permit expansion or contraction thereof along the first direction DR1, and thus the fifth part PT2_1 may be extendable out of and retractable into the fourth cavity CVT2_1.

Between the first casing CS1 and the second casing CS2, the sixth part PT3_1 may be externally exposed to cover a lower portion of the third casing CS3.

Different from the cover CVP illustrated in FIG. 12, the second cover CVP_1 shown in FIG. 15 may be extendable out of and retractable into both of the first casing CS1 and the second casing CS2. Folding or unfolding of the display device DD may include the second cover CVP_1 being extendable out of or retractable into both of the first casing CS1 and the second casing CS2 simultaneously, without being limited thereto.

Referring to FIG. 16, the third cover CVP_2 may be disposed below the third casing CS3 and connected to the first casing CS1 and the second casing CS2. The third cover CVP_2 may be fixed to the second casing CS2 and may be extendable out of or retractable into the first casing CS1.

The first casing CS1 may have a fifth cavity CVT1_2, and the second casing CS2 may have a sixth cavity CVT2_2. A first space SPC1 may be defined at a distal end of the fifth cavity CVT1_2. The first space SPC1 and an entrance of the fifth cavity CVT1_2 may be connected to each other by a tunnel TUN. In a view along the first direction DR1, the first space SPC1 may have a size (e.g., dimension) along the second direction DR2 and/or the third direction DR3 which greater than a size of the tunnel TUN.

The second cover CVP_2 may include a seventh part PT1_2 disposed in the fifth cavity CVT1_2, an eighth part PT2_2 disposed in the sixth cavity CVT2_2, and a ninth part PT3_2 disposed between the first casing CS1 and the second casing CS2.

The seventh part PT1_2 may be extendable out of or retractable into the fifth cavity CVT1_2. That is, the folding and unfolding of the display device DD respectively includes extension of the seventh part PT1_2 of the second cover CVP_2 from the tunnel TUN of the fifth cavity CVT1_2 and retraction of the seventh part PT1_2 of the second cover CVP_2 into the tunnel TUN of the fifth cavity CVT1_2, via the entrance. A roller ROL may be disposed in the first space SPC1. The seventh part PT1_2 may extend around the roller ROL. The roller ROL may clockwise or counterclockwise rotate about a rotation axis RX parallel to the second direction DR2.

According to the rotation of the roller ROL, the seventh part PT1_2 may be rollable around or unrollable from the roller ROL. When the roller ROL rotates by folding or unfolding of the display device DD, the seventh part PT1_2 may be extendable out of or retractable into the fifth cavity CVT1_2. That is, the folding and unfolding of the display device DD respectively includes unrolling and rolling of the seventh part PT1_2 of the second cover CVP_2 around the roller ROL.

The eighth part PT2_2 may be fixedly connected to the second casing CS2. Between the first casing CS1 and the second casing CS2, the ninth part PT3_2 may cover a lower portion of the third casing CS3.

Figure 17:
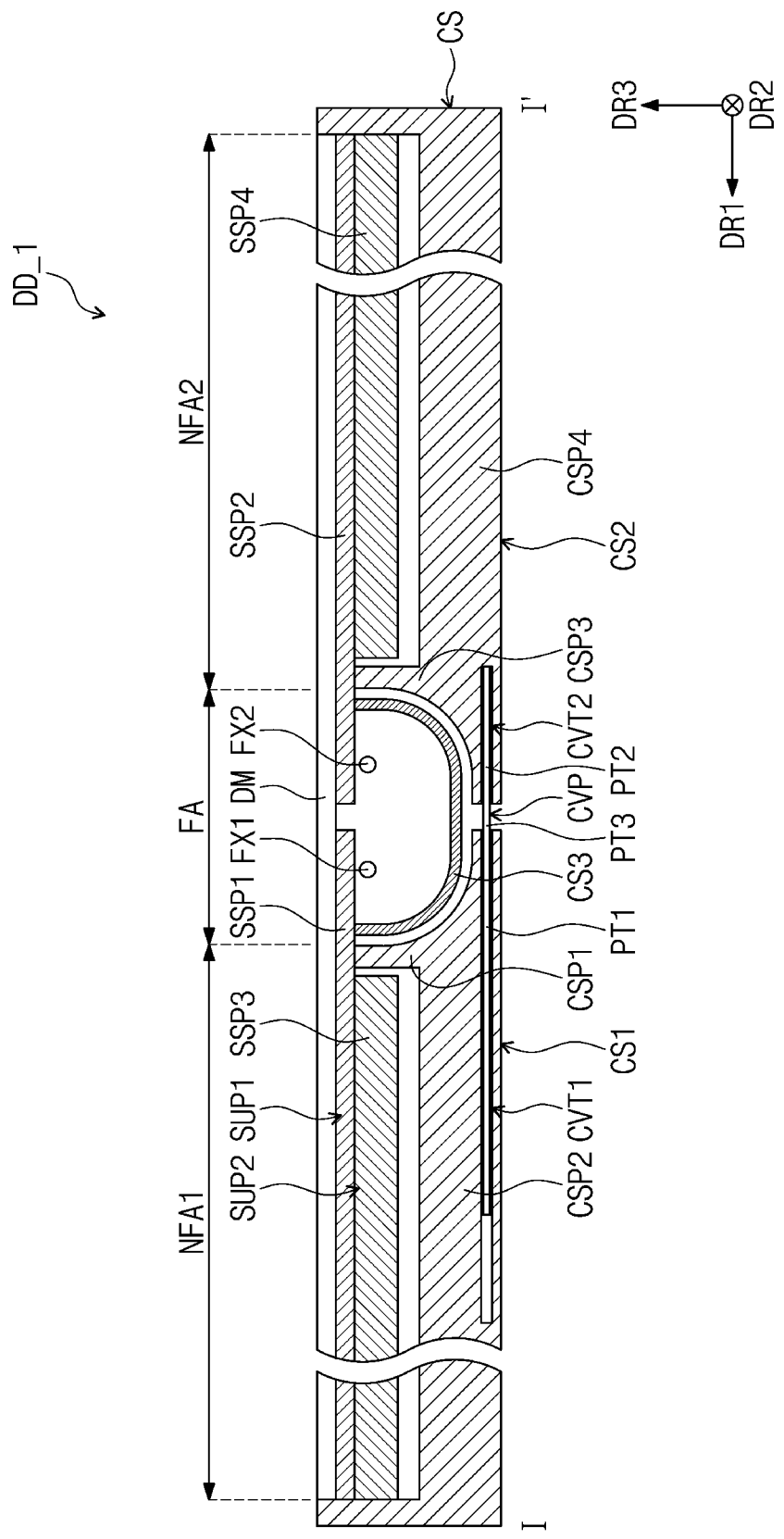
FIGS. 17 and 18 illustrate cross-sectional views showing embodiments of a display device which is unfolded and folded.
Figure 18:
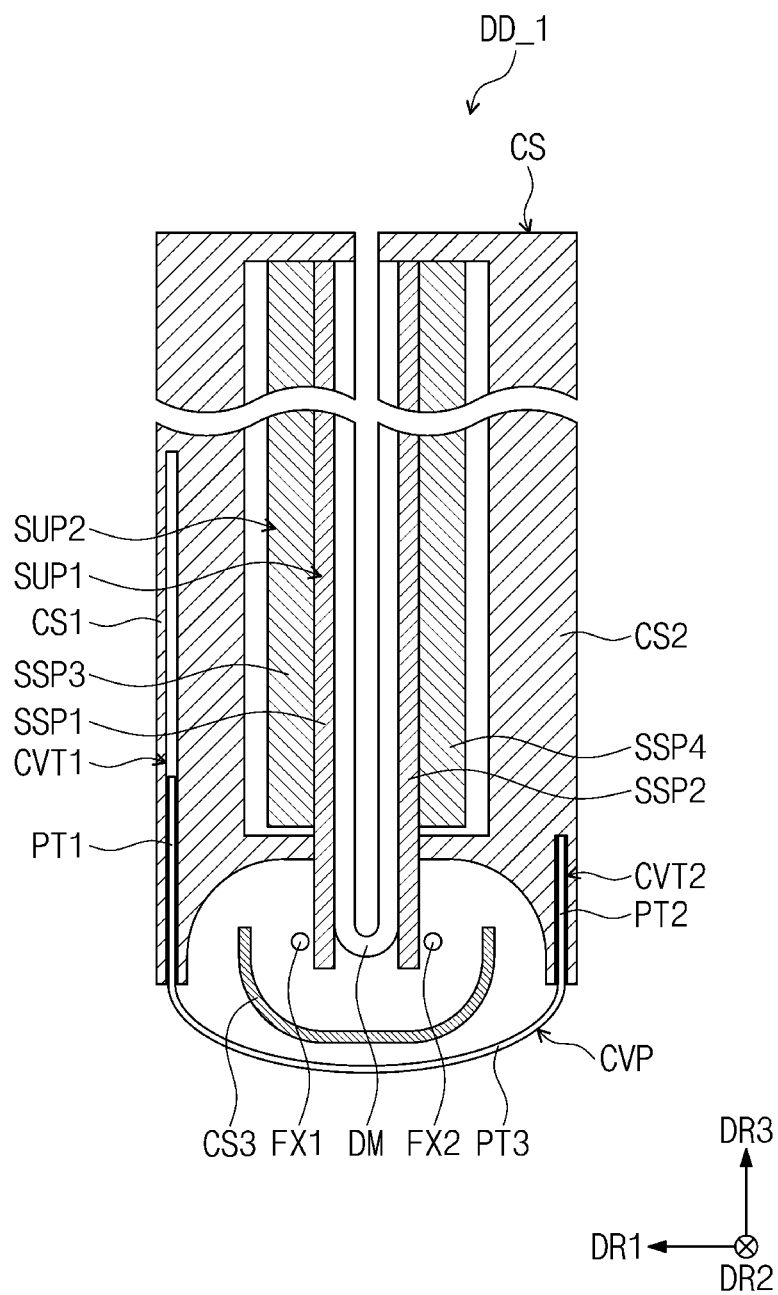

FIGS. 17 and 18 illustrate cross-sectional views showing an embodiment of a display device DD_1.

FIGS. 17 and 18 exemplarily show cross-sections that correspond to those illustrated in FIGS. 11 and 14, respectively. The following will focus on differences between the display device DD_1 and the display device DD shown in FIGS. 11 and 14.

Referring to FIGS. 17 and 18, the display device DD_1 may be flat or unfolded as shown in FIG. 17 or may be folded as shown in FIG. 18. The cover CVP may include a resilient plastic or metal.

Unlike the display device DD shown in FIGS. 11 and 14, the display device DD_1 may not include an elastic member. The first part PT1 may be disposed in the first cavity CVT1. At a distal end of the second cavity CVT2 which is furthest from the first cavity CVT1, the second part PT2 may be fixedly connected to the second casing CS2. An end of the cover CVP within the first cavity CVT1 is unattached to the first casing CS1.

When the first elastic member ELP1 is disposed in the first cavity CVT1, the first part PT1 may easily be extendable out of or retractable into the first cavity CVT1. However, even when the first elastic member ELP1 is not disposed in the first cavity CVT1, folding and unfolding of the display device DD_1, the cover CVP may still be extendable out of or retractable into the first cavity CVT1 solely by the elasticity of the cover CVP.

In FIGS. 17 and 18, the first part PT1 is extendable out of or retractable into the first casing CS1 and the second part PT2 is fixed to the second casing CS2, but the display device DD_1 is not limited thereto. In an embodiment, for example, the second part PT2 may be extendable out of or retractable into the second casing CS2, and the first part PT1 may be fixed to the first casing CS1.

According to embodiments, during folding or unfolding of a display device DD, a cover CVP slidably disposed within a first casing CS1 and/or a second casing CS2 may be extendable out of or retractable into the first casing CS1 and/or the second casing CS2, and thus may isolate spaces among the aforementioned casings from outside the display device DD. As a result, the cover CVP which isolates spaced from outside the display device DD may reduce or effectively prevent introduction of foreign substances through the spaces among the aforementioned casings.

Although the invention is described in conjunction with embodiments thereof, it would be understood by those skilled in the art that the invention can be modified or changed in various ways without departing from spirit and scope of the invention defined by the appended claims. Further, the embodiments disclosed herein are not intended to limit the technical spirit of the invention and all technical spirit within the claims and their equivalents should be construed as being included in the invention.

What is claimed is:

1. A display device, comprising:
   a display panel including a folding area at which the display device is foldable and unfoldable;
   a first casing and a second casing arranged in a first direction along the display panel, the first casing and the second casing spaced apart from each other at the folding area;
   a third casing between the first casing and the second casing along the first direction, the third casing corresponding to the folding area; and
   a cover facing the display panel with the third casing therebetween, the cover connected to each of the first casing and the second casing, at an inside of each of the first casing and the second casing,
   wherein the cover includes:
   a first portion slidably disposed in the first casing,
   a second portion slidably disposed in the second casing, and
   the first portion extending from the first casing to outside the first casing and the second casing, to define a third portion connecting the first portion to the second portion, and
   folding and unfolding of the display device respectively includes extension of the cover from of the first casing and retraction of the cover into the first casing.

2. The display device of claim 1, wherein
   the cover includes an end at the second casing, and
   a position of the end of the cover is fixed relative to the second casing.

3. The display device of claim 1, wherein
   the first casing includes a first cavity open at the folding area,
   the second casing includes a second cavity open at the folding area, and
   the cover extends from the first cavity to the second cavity and includes:
   the first portion in the first cavity of the first casing;
   the second portion in the second cavity of the second casing; and
   the third portion connecting the first portion to the second portion, the third portion being outside of both of the first casing and the second casing.

4. The display device of claim 3, wherein at the folding area:
   the first cavity is open at a side of the first casing and extends along the first direction, wherein the side of the first casing faces the second casing, and
   the second cavity is open at a side of the second casing and extends along the first direction, wherein the side of the second casing faces the first casing.

5. The display device of claim 3, wherein the folding and unfolding of the display device respectively includes extension of the first portion of the cover from the first cavity and retraction of the first portion of the cover into the first cavity.

6. The display device of claim 3, further comprising a first elastic member in the first cavity of the first casing and connected to the first portion of the cover which is in the first cavity.

7. The display device of claim 6, wherein
   the first cavity includes a distal end furthest from the second cavity, and
   the first elastic member is connected to the first casing at the distal end of the first cavity.

8. The display device of claim 3, wherein
   the second cavity includes a distal end furthest from the first cavity, and
   the second portion of the cover is connected to the second casing at the distal end of the second cavity.

9. The display device of claim 3, wherein the folding and unfolding of the display device respectively includes extension of the second portion of the cover from the second cavity and retraction of the second portion of the cover into the second cavity.

10. The display device of claim 9, further comprising a second elastic member in the second cavity of the second casing and connected to the second portion of the cover which is in the second cavity,
    wherein
    the second cavity includes a distal end furthest from the first cavity, and
    the second elastic member is connected to the second casing at the distal end of the second cavity.

11. The display device of claim 3, further comprising a roller in the first cavity of the first casing and connected to the first portion of the cover,
    wherein the folding and unfolding of the display device further respectively includes unrolling and rolling of the first portion of the cover around the roller.

12. The display device of claim 11, wherein the first cavity of the first casing includes:
    a distal end furthest from the second cavity;
    an entrance at which the first cavity is open to the folding area;
    a first space at the distal end of the first cavity;
    the roller in the first space; and
    a tunnel connecting the first space and the entrance of the first cavity to each other,
    wherein the folding and unfolding of the display device respectively includes extension of the first portion of the cover from the tunnel of the first cavity and retraction of the first portion of the cover into the tunnel of the first cavity, via the entrance.

13. The display device of claim 1, wherein the cover includes a metal.

14. The display device of claim 1, wherein the display panel includes:
    a first non-folding area corresponding to the first casing; and
    a second non-folding area corresponding to the second casing, the first and second non-folding areas being arranged along the first direction with the folding area therebetween.

15. The display device of claim 14, wherein
    the display panel includes a top surface at the first non-folding area and a top surface at the second non-folding area, and
    the display device which is folded disposes the top surface at the first non-folding area facing the top surface at the second non-folding area.

16. The display device of claim 14, further comprising:

a first sub-supporter between the first casing and the first non-folding area of the display panel;

a second sub-supporter between the second casing and the second non-folding area of the display panel;

a third sub-supporter between the first casing and the first sub-supporter; and a fourth sub-supporter between the second casing and the second sub-supporter, wherein the first sub-supporter extends further than the third sub-supporter to define an extended portion of the first sub-supporter at the folding area, the second sub-supporter extends further than the fourth sub-supporter to define an extended portion of the second sub-supporter at the folding area, and folding of the display device includes disposing the extended portion of the first sub-supporter and the extended portion of the second sub-supporter within the third casing.

17. The display device of claim 16, wherein the third casing includes:

a bottom surface facing the first casing and the second casing, the bottom surface convexly curved away from the display panel, and a top surface opposite to the bottom surface and concavely curved away from the display panel.

18. The display device of claim 17, wherein the first casing includes:

a first casing portion extended along the bottom surface of the third casing and toward the first sub-supporter; and a second casing portion extended along the first direction from the first casing portion and facing the first sub-supporter with the third sub-supporter therebetween, and the second casing includes:

a third casing portion extended along the bottom surface of the third casing and toward the second sub-supporter; and a fourth casing portion extended along the first direction from the third casing portion and facing the second sub-supporter with the fourth sub-supporter therebetween.

19. The display device of claim 18, wherein the third sub-supporter is spaced apart from the third casing with the first casing portion therebetween, and the fourth sub-supporter is spaced apart from third casing with the third casing portion therebetween.

* * * * *